United States Patent
Herzig et al.

(10) Patent No.: US 9,322,951 B2
(45) Date of Patent: Apr. 26, 2016

(54) WEATHER AND SATELLITE MODEL FOR ESTIMATING SOLAR IRRADIANCE

(71) Applicants: Michael Herzig, Edgewater, NJ (US); Matthew Williams, San Francisco, CA (US); Shawn Kerrigan, Redwood City, CA (US)

(72) Inventors: Michael Herzig, Edgewater, NJ (US); Matthew Williams, San Francisco, CA (US); Shawn Kerrigan, Redwood City, CA (US)

(73) Assignee: LOCUS ENERGY, INC.

( * ) Notice: Subject to any disclaimer, the term of this patent is extended or adjusted under 35 U.S.C. 154(b) by 237 days.

(21) Appl. No.: 13/623,240

(22) Filed: Sep. 20, 2012

(65) Prior Publication Data

US 2013/0166266 A1 Jun. 27, 2013

Related U.S. Application Data

(63) Continuation-in-part of application No. 12/777,224, filed on May 10, 2010, now Pat. No. 8,725,459, which is a continuation-in-part of application No. 11/949,035, filed on Dec. 2, 2007, now Pat. No.
(Continued)

(51) Int. Cl.
*G06F 17/10* (2006.01)
*G01W 1/10* (2006.01)
*G01W 1/12* (2006.01)
(Continued)

(52) U.S. Cl.
CPC . *G01W 1/10* (2013.01); *G01W 1/12* (2013.01); *H02J 3/383* (2013.01); *H02J 13/0062* (2013.01); *H02J 2003/003* (2013.01);
(Continued)

(58) Field of Classification Search
None
See application file for complete search history.

(56) References Cited

U.S. PATENT DOCUMENTS 3,872,286 A 3/1975 Putman
4,280,061 A 7/1981 Lawson-Tancred
(Continued)

FOREIGN PATENT DOCUMENTS

WO 0225987 A2 3/2002
WO 2006119031 11/2006

OTHER PUBLICATIONS

Kroposki et al. Photovoltaic Module Energy Rating Methodology Development 25th PVSC, May 13-17, 1996.*
(Continued)

*Primary Examiner* — Saif Alhija
*Assistant Examiner* — Cuong Luu
(74) *Attorney, Agent, or Firm* — Jennifer Meredith, Esq.; Meredith & Keyhani, PLLC

(57) ABSTRACT

Solar irradiance, the energy from the Sun's electromagnetic radiation, has a wide range of applications from meteorology to agronomy to solar power. Solar irradiance is primarily determined by a location's spatial relationship with the Sun and the atmospheric conditions that impact the transmission of the radiation. The spatial relationship between the Sun and a location on Earth is determined by established astronomical formulas. The impact of atmospheric conditions may be estimated via proxy using pixels from satellite imagery. While satellite-based irradiance estimation has proven effective, availability of the input data can be limited and the resolution is often incapable of capturing local weather phenomena. Brief qualitative descriptions of general atmospheric conditions are widely available from internet weather services at higher granularity than satellite imagery. This methodology provides logic for quantifying the impact of qualitative weather observations upon solar irradiance, and the integration of this methodology into solar irradiance estimation models.

6 Claims, 10 Drawing Sheets

Potential Components

Related U.S. Application Data 7,742,897, and a continuation-in-part of application No. 11/673,649, filed on Feb. 12, 2007, now abandoned.

(60) Provisional application No. 61/546,825, filed on Oct. 13, 2011.

(51) Int. Cl.
  *H02J 3/38* (2006.01)
  *H02J 13/00* (2006.01)
  *H02J 3/00* (2006.01)

(52) U.S. Cl.
  CPC ........... *Y02E 10/563* (2013.01); *Y02E 60/7838* (2013.01); *Y04S 10/54* (2013.01); *Y04S 40/124* (2013.01)

(56) References Cited

U.S. PATENT DOCUMENTS

| | | | |
|---|---|---|---|
| 4,752,697 A | 6/1988 | Lyons | |
| 6,311,137 B1 | 10/2001 | Kurokami | |
| 7,020,566 B2 | 3/2006 | Villicana | |
| 7,133,787 B2 | 11/2006 | Mizumaki | |
| 7,742,897 B2 | 6/2010 | Herzig | |
| 8,682,585 B1 * | 3/2014 | Hoff | 702/3 |
| 2002/0033020 A1 | 3/2002 | Tonomura | |
| 2002/0143693 A1 | 10/2002 | Soestbergen | |
| 2004/0067746 A1 | 4/2004 | Johnson | |
| 2004/0103056 A1 | 5/2004 | Ikeda | |
| 2004/0138977 A1 | 7/2004 | Tomkins | |
| 2004/0148336 A1 | 7/2004 | Hubbard et al. | |
| 2004/0176965 A1 | 9/2004 | Winch | |
| 2004/0177027 A1 | 9/2004 | Adachi | |
| 2004/0230377 A1 | 11/2004 | Ghosh | |
| 2004/0236587 A1 | 11/2004 | Nalawade | |
| 2005/0004839 A1 | 1/2005 | Bakker | |
| 2005/0131810 A1 | 6/2005 | Garrett | |
| 2006/0271214 A1 | 11/2006 | Brown | |
| 2007/0162367 A1 | 7/2007 | Smith | |
| 2007/0174219 A1 | 7/2007 | Bryant | |
| 2007/0203860 A1 | 8/2007 | Golden | |
| 2007/0219932 A1 | 9/2007 | Carroll | |
| 2007/0226163 A1 | 9/2007 | Robles | |
| 2008/0091590 A1 | 4/2008 | Kremen | |
| 2008/0091625 A1 | 4/2008 | Kremen | |
| 2008/0172256 A1 | 7/2008 | Yekutiely | |
| 2008/0215500 A1 | 9/2008 | De | |
| 2009/0177458 A1 | 7/2009 | Hochart | |
| 2010/0219983 A1 | 9/2010 | Peleg | |
| 2010/0271222 A1 | 10/2010 | Kerrigan | |
| 2011/0282601 A1 | 11/2011 | Hoff | |
| 2013/0085885 A1 * | 4/2013 | Sahai et al. | 705/26.4 |

OTHER PUBLICATIONS

Hammer et al. Solar Energy Assessment Using Remote Sensing Technologies Remore Sensing of Environment 86, pp. 423-432, 2005.*

Danny Li, Tony Lam Determining the Optimum Tilt Angle and Orietantion for Solar Energy Collection Based on Measure Solar Radiance Data International Journal of Photoenergy, vol. 2007, Article ID 85402, Sep. 2007.*

'Atlas DCA', Peak electronic design, ltd., 2008.

Burger, Werner, Asset Securitisation, 2006, pp. 1-67.

Wang, Jianhui, The Application of Grey System Theory in Asset Securitizaton, 2007, pp. 1-3.

Li, Danny HW and Tony NT Lam, "Determining the optimum tilt angle and orientation for solar energy collection based on measured solar radiance data." International Journal of Photoenergy 2007 (2007).

* cited by examiner

Figure 1- Comparison Calculations

Figure 2 – Potential Components

Figure 3- Sample PV Configuration

Figure 4- Sample SHW Configuration

WEATHER AND SATELLITE MODEL FOR ESTIMATING SOLAR IRRADIANCE

This application claims priority to provisional patent application No. 61/546,825 filed Oct. 13, 2011 entitled "Weather and Satellite Model for Estimating Solar Irradiance", and is a continuation-in-part of application Ser. No. 12/777,224 filed May 10, 2010 now U.S. Pat. No. 8,725,459 entitled "IRRADIANCE MAPPING LEVERAGING A DISTRIBUTED NETWORK OF SOLAR PHOTOVOLTAIC SYSTEMS" which is a continuation-in-part of application Ser. No. 11/949,035 filed Dec. 2, 2007 now issued as U.S. Pat. No. 7,742,897 entitled "Systems and Methods for Monitoring and Diagnosing the Power Generated by Renewable Power Systems" and claims priority to and is a continuation-in-part of application Ser. No. 11/673,649 Feb. 12, 2007 now abandoned entitled "Systems and Methods for Providing Renewable Power Systems by Aggregate Cost and Usage" all of which are incorporated herein by reference.

With the increasing popularity of solar panels, it has become increasingly more desirable to map the relative concentration of solar radiation hitting the earth's surface in different geographic regions. This may be useful to make determination of whether to buy a photovoltaic solar system, the appropriate size of the system and the proper angle of installation. The process of mapping the intensity of the sun is generally referred to as solar resource assessment. The output of solar resource assessments are databases that catalog the regional intensity of the solar resource, on a given number of minutes increment or an hourly basis, over the course of many years. The databases are often displayed as maps, having an appearance similar to topographic maps, and shadings corresponding to the intensity of the average annual solar resource. These maps are referred to as irradiance maps.

Solar irradiance, the energy from the Sun's electromagnetic radiation, has a wide range of applications from meteorology to agronomy to solar power. Constructing detailed irradiance maps is a challenging but important goal. Irradiance maps can be useful for a number of things, from estimating crop growth to estimating potential output from PV systems. Developing irradiance maps can be challenging because irradiance sensors are too expensive to deploy widely, and satellite-based methodologies tend to have wide margins of error.

Detailed site-specific irradiance is important in a number of different ways, particularly in the context of solar power. Recent, real-time and forecasted irradiance for specific locations are important for understanding the performance of PV systems in the field, both small-scale distributed systems and large-scale solar farms. Granular irradiance data, representing typical irradiance values in specific locations, its importance for estimating potential output from future installations of solar PV systems in those specific locations. Acquiring irradiance data generally comes from one of four sources, (1) Satellite-based irradiance estimates, which while fairly reliable over long time horizons, lack enough precision to a) fully characterize the potential solar resources for existing system performance assessments or, b) accurately estimate potential output from a new system under design consideration; (2) Weather station data from somewhere in the same region. While this represents actually measured data, there are not many of these weather stations around, so the weather data is generally not precise enough for the location under consideration; (3) Historical irradiance studies: while these studies may provide reasonably accurate estimates based on historical experience, they do not solve the problem of the need for recent real-time and forecasted irradiance for specific locations; (4) One-off studies of irradiance: sometimes people may invest in irradiance monitoring equipment for a particular site that is under consideration for construction of a solar system. While precise, this solution is generally extremely expensive and time consuming.

The amount of solar irradiance reaching a surface on Earth is composed of direct, diffuse, and ground reflected irradiance. These different components of irradiance often have different impacts on objects. For example, the performance of solar panels under direct and diffuse light is different. Many commonly deployed irradiance sensors do not provide information on the different direct, diffuse, and ground reflected irradiance components, however, and instead simply provide aggregate global horizontal irradiance (GHI) or plane of array irradiance (IPoA) measurements. Atmospheric models may estimate irradiance at the earth's surface from weather data or satellite imagery, and these models may provide estimates of the direct, diffuse, ground reflected irradiance values in addition to GHI or IPoA values.

In the case of global horizontal irradiance (GHI), the total amount of solar irradiance reaching a surface horizontal to the ground, irradiance is composed of diffuse horizontal irradiance (DHI) and direct normal irradiance (DNI) corrected for solar position, with no ground reflected irradiance due to the horizontal positioning. Using this relationship and empirical studies, methodology was developed to estimate DNI, DHI, IPOA, plane of array direct irradiance (HBEAM), plane of array diffuse irradiance (HDIFF), and plane of array ground reflected irradiance (HGRF) from GHI. While this methodology has been proven effective, it is restricted to using GHI for making all estimates and is thus subject to biases and errors associated with the input. Additional types of solar irradiance observations, such as IPoA, would help to reduce model bias and improve accuracy. This methodology provides logic for improving estimates of solar irradiance components (GHI, DNI, DHI, IPoA, HBEAM, HDIFF, HGRF) by leveraging sensors recording GHI or IPoA and atmospheric solar irradiance models.

There exist many variants of solar irradiance estimation models, ranging from neural networks to temperature change based methodology. One method for irradiance estimation models is based on satellite imagery. While details of the methodology differ based on the satellite used, the overall principle of using pixels to approximate atmospheric conditions is consistent across models. A major obstacle to the usability of irradiance estimation models is the availability of input data. Satellite coverage, historical imagery availability, imagery resolution, and the number of unique satellites are limited due to the costs associated with building and maintaining geostationary satellites. Additionally, the image processing techniques required for satellite based irradiance estimation models can be too technical for some users to implement. Observational weather data is widely available through numerous monitoring networks at a granularity much higher than satellite imagery. Standard quantitative weather variables lack the explanatory power of satellite imagery, because these variables describe aspects of the atmosphere, rather than overall conditions. Qualitative weather observations describe general atmospheric conditions and thus have strong explanatory power compared to quantitative weather variables. In a qualitative state, the weather description cannot be used as input to numerical irradiance models, thus the need for methodology to quantify this information.

The present invention provides methods for converting qualitative weather descriptions into quantitative values. This may be used to develop a solar irradiance estimation model. The solar irradiance estimation model may be based on weather data and according to another aspect of the present invention based on weather data and satellite imagery. These and other features, aspects and advantages of the present invention will become better understood with reference to the following description and claims.

SUMMARY OF THE INVENTION

The present invention relates generally to systems and methods for estimating solar irradiance components.

According to one embodiment of the present invention, a computer implemented weather based method of estimating solar irradiance, the method comprising: accepting a text description of a weather condition for a given time in a computing system; classifying by a computing system the text description of a weather condition for a given time into a classification string according to the text description of a weather condition for a given time by a computing system; providing, in a computing system, a dummy variable representing the respective classification string match; providing a coefficient for each dummy variable in a computing system; accepting in a computing system a theoretical clear sky global horizontal irradiance, a coefficient for temperature, ambient temperature and a dew point; subtracting the dew point from the temperature to provide a Cloud Formation Level (CFL) value in a computing system; providing a coefficient for the CFL; determining an estimated global horizontal irradiance by a computing system, wherein the estimated global horizontal irradiance is the theoretical clear sky global horizontal irradiance multiplied by the total of the sum of the series of coefficients for respective dummy variables multiplied by the dummy variable representing the respective classification string match added to the coefficient for temperature multiplied by the ambient temperature added to the CFL multiplied by a coefficient for the CFL.

According to another embodiment of the present invention, a computer implemented weather and satellite based method of estimating solar irradiance is provided, the method comprising: accepting a text description of a weather condition for a given time in a computing system; classifying by a computing system the text description of a weather condition for a given time into a classification string according to the text description of a weather condition for a given time by a computing system; providing, in a computing system, a dummy variable representing the respective classification string match; providing a coefficient for each dummy variable in a computing system; accepting in a computing system a theoretical clear sky global horizontal irradiance, a coefficient for temperature, ambient temperature and a dew point; subtracting the dew point from the temperature to provide a Cloud Formation Level (CFL) value in a computing system; providing a coefficient for the CFL; determining an estimated global horizontal irradiance by a computing system, wherein the estimated global horizontal irradiance is the theoretical clear sky global horizontal irradiance multiplied by the total of the sum of the series of coefficients for respective dummy variables multiplied by the dummy variable representing the respective classification string match added to the coefficient for temperature multiplied by the ambient temperature added to the CFL multiplied by a coefficient for the CFL added to a cloud index multiplied by a coefficient for a cloud index added to the total of the sum of the series of coefficients for respective brightness temperature multiplied by the brightness temperature.

These and other features, aspects and advantages of the present invention will become better understood with reference to the following description and claims.

DETAILED DESCRIPTION OF THE INVENTION

Figure 1:
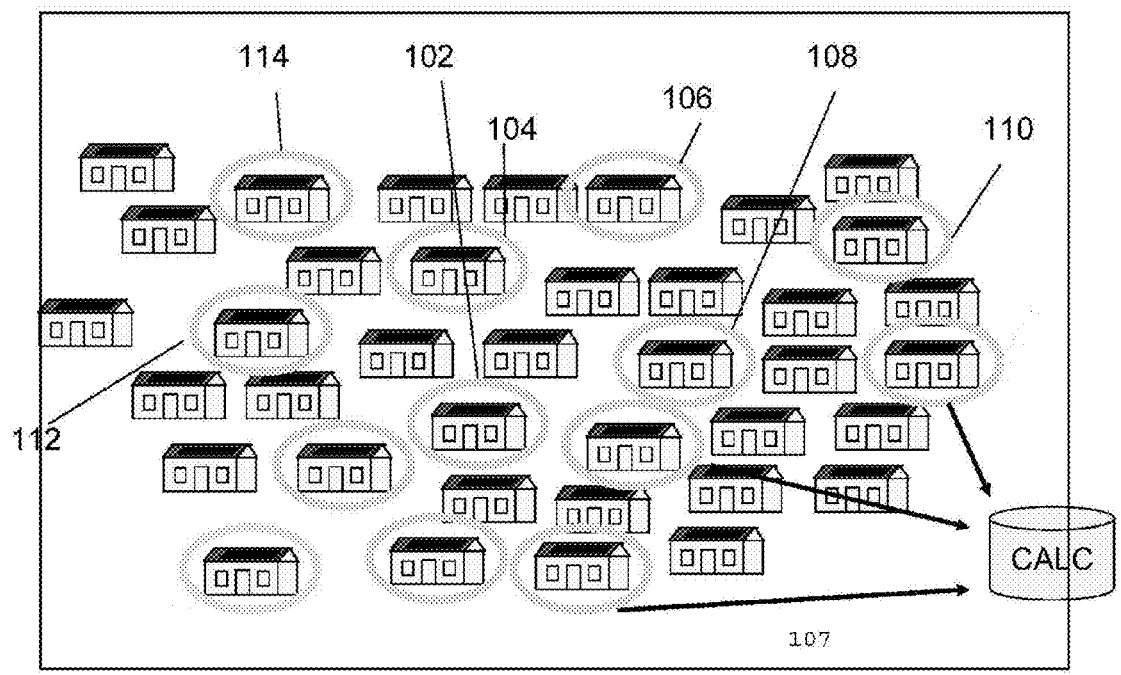
FIG. 1 depicts the present invention.
Figure 2:
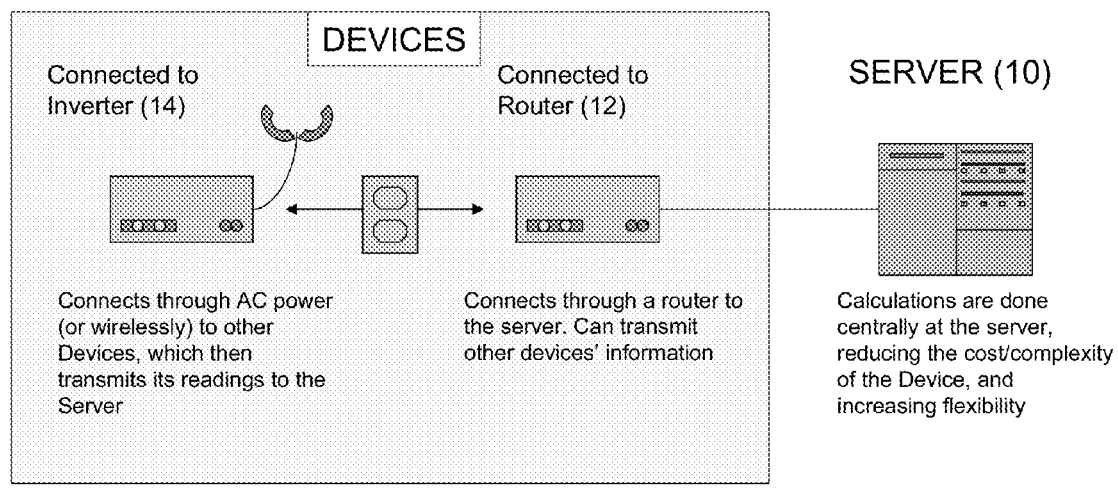
FIG. 2 depicts the present invention.
Figure 3:
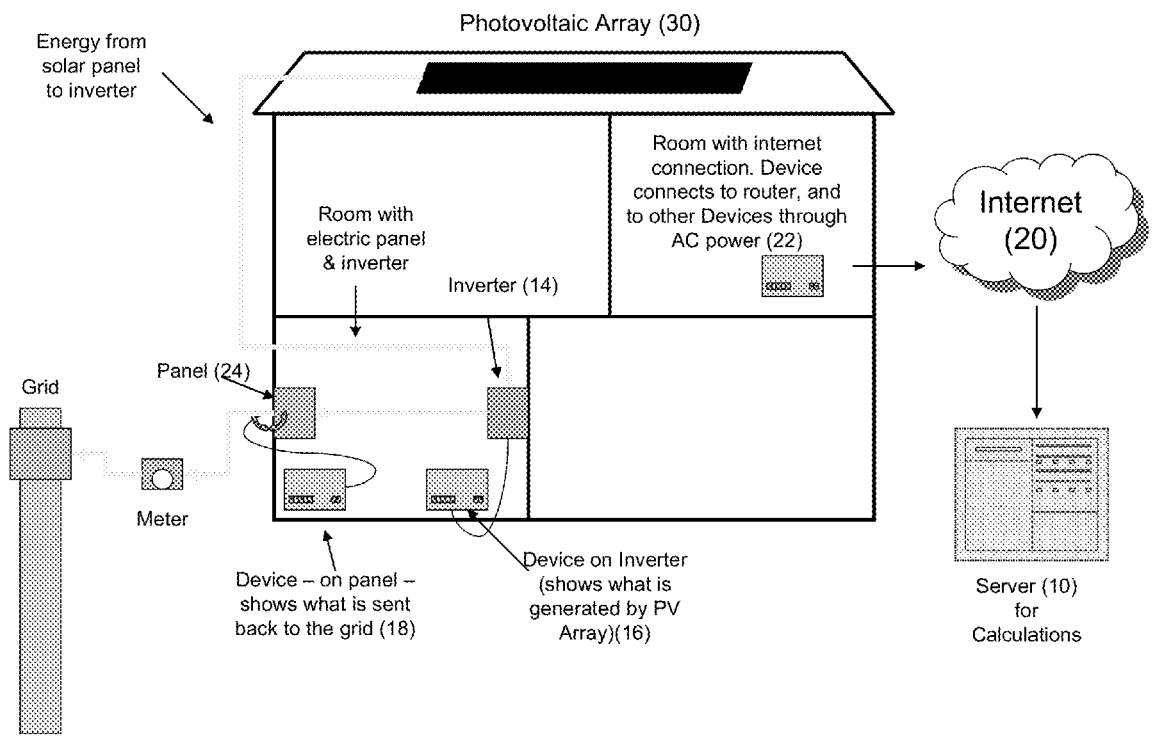
FIG. 3 depicts the present invention.
Figure 4:
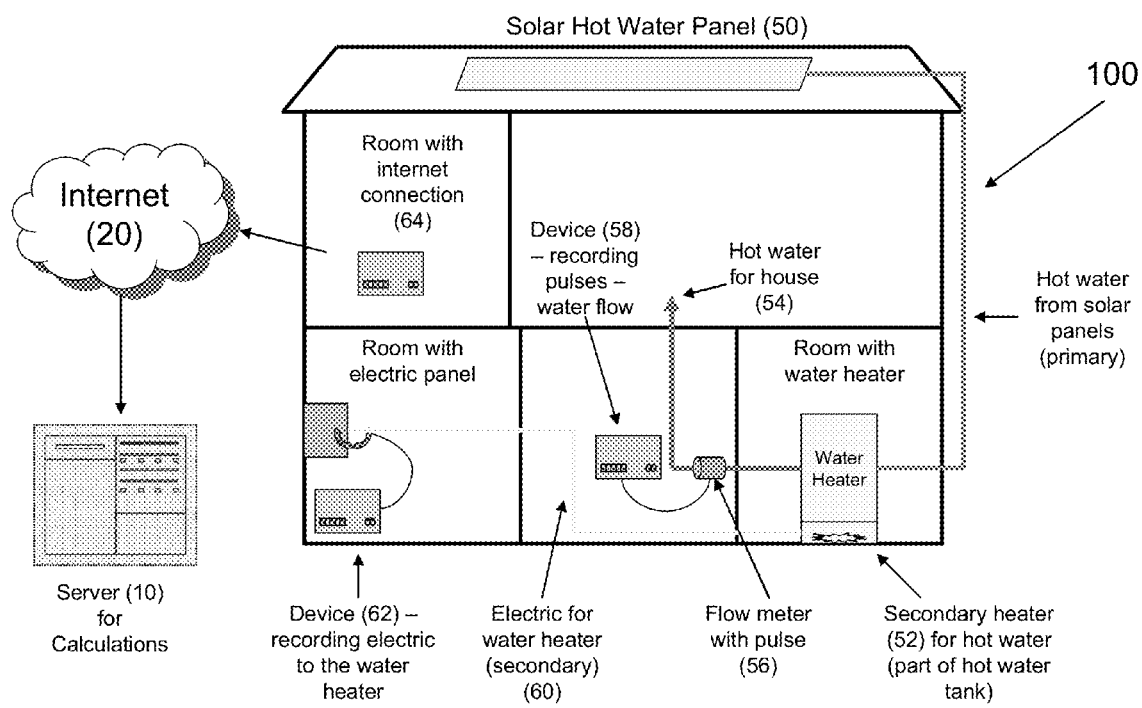
FIG. 4 depicts the present invention.
Figure 5:
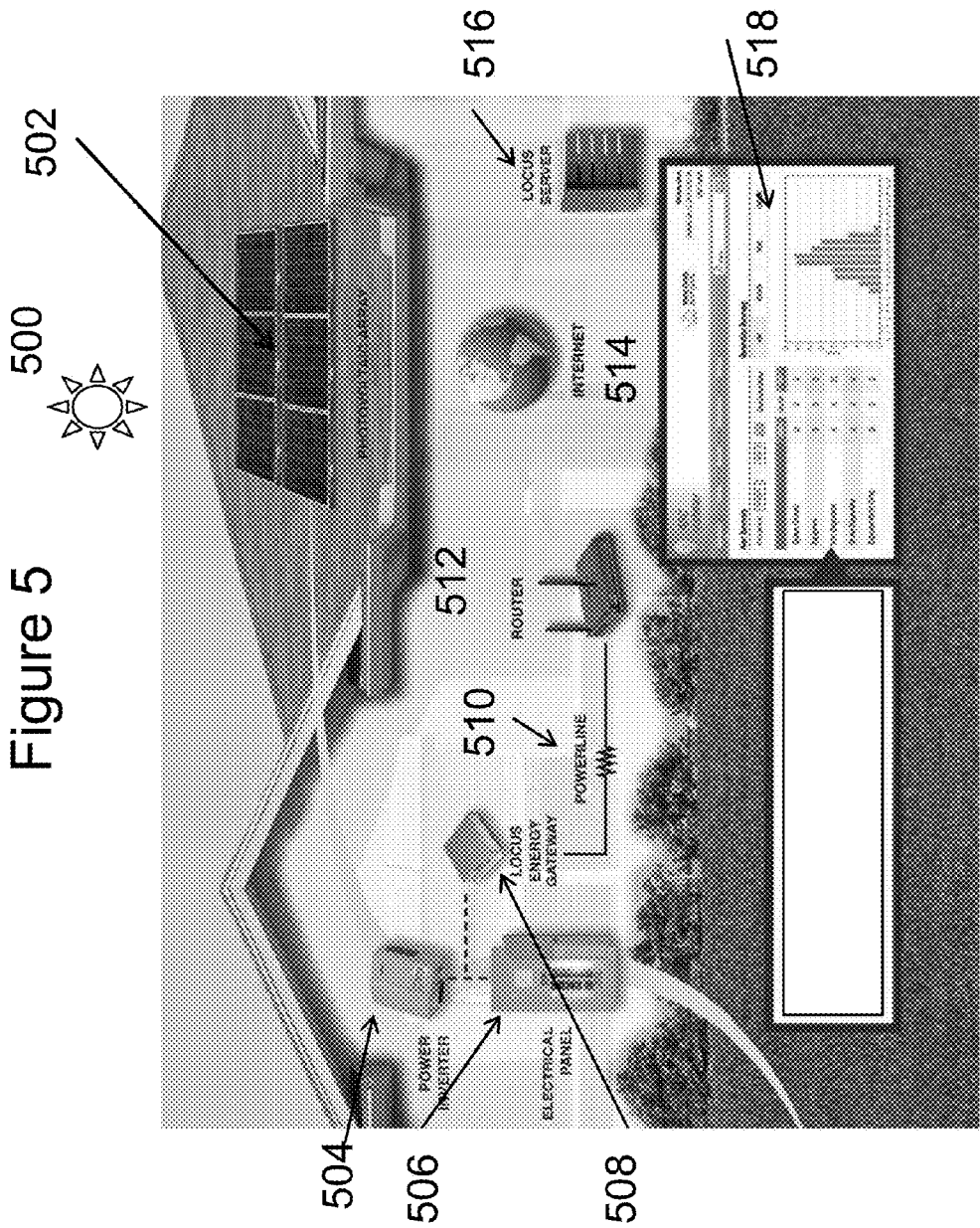
FIG. 5 depicts the present invention.
Figure 6:
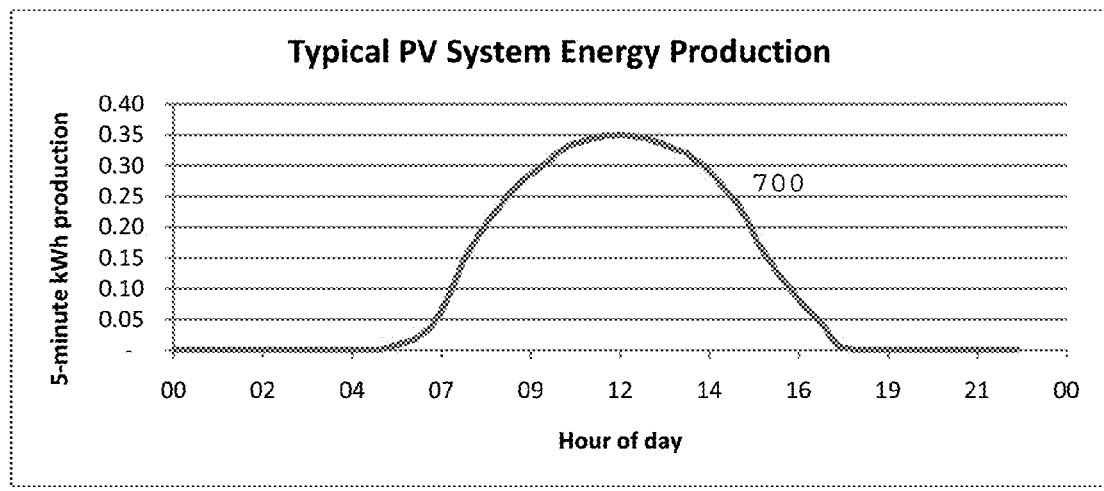
FIG. 6 depicts the present invention.

The following detailed description is of the best currently contemplated modes of carrying out the invention. The description is not to be taken in a limiting sense, but is made merely for the purpose of illustrating the general principles of the invention, since the scope of the invention is best defined by the appended claims.

FIGS. 1-5 provide examples of a monitored electrical system (in this case a renewable power system and more specifically a photovoltaic array solar panel also referred to herein as a solar photovoltaic system or solar powered system) from which information may be obtained. According to the example shown, there is a server 10 and at least one monitored electrical system (e.g. 102, 104, 106, 108, 110, 112) which is provided to a user or consumer. There may be at least one data server (10), at least one generation monitoring device (16) in communication with the monitored electrical system (at premise monitored electrical system (30)) and at least one communication node (22) in communication with at least one of the monitored electrical system (30), the generation monitoring device (16) and the data server (10). It should be understood the data server may be a single computer, a distributed network of computers, a dedicated server, any computer processor implemented device or a network of computer processor implemented devices, as would be appreciated by those of skill in the art. The monitored electrical system may have background constants that are entered into the system during data setup; populating this part of the data structure is one of the initial steps to the process. During this time, all required (or potentially required) background information may be loaded into the system. This data will later be used for system calculations and diagnostics. Background constants may include: (1) Full Calendar with sunrise and sunset according to latitude throughout the year; (2) Insolation or 'incident solar radiation': This is the actual amount of sunlight falling on a specific geographical location. There are expected amounts of radiation which will fall on an area each day, as well as an annual figure. Specific Insolation is calculated as kWh/m2/day. The importance of this variable is that it can combine several other Background Constants; and (3) Location Functionality. It is envisioned that some of this information may be input and some may be determined automatically. The proximity of each system to each other system may be determined, and forms a part of the methods used to determine the geographic average of the renewable energy systems. While there are different specific methods of implementing Location Functionality, generally this relies on a large database of locations which are tied to zones. Because the relational distances between the zones are stored within the software, the distances between any two locations can then be easily and accurately calculated.

There may be the step of determining at least one diagnostic variable for each monitored electrical system (30). These are the variables which affect the diagnostics. Examples include: (1) Adjustments to the permitted size of each zone. When there are fewer systems within an area, the algorithm may be adjusted to allow for a statistically accurate comparison, but this would also reduce the ability of the comparison to control as well for weather, etc., since there may be more variances over the distance; (2) Adjustments to the sensitivity of the diagnostics. Changing thresholds will impact when a particular renewable energy system is identified by the software as having an issue. Each diagnostic variable is saved into at least one data server.

At least one system coefficient for each monitored electrical system may be determined and saved in the data server(s). These are set up when each new renewable energy system is entered into the software, and they provide key information about the expected performance of each system. The coefficients will generally stay the same for the life of the system. Not all system coefficients will be used in each comparative diagnostic, but they all may be used at some point to provide additional functionality to the process. One critical aspect of the system coefficients is that ALL coefficients for all renewable energy systems must be assigned using the same approach and rules. The reason for this is that if the system coefficients are not uniformly applied, the normalized performance values (described below) will not be accurate. The items which can make up the system coefficients include: (1) expected generation by day, month and year for the system; (2) expected generation on an ongoing basis (e.g. average generation each day, regardless of time of the year); (3) renewable energy system size; (4) system technology; (5) system tolerances (e.g. how accurate information from the system's components will be); (6) system shading; (7) system orientation; and (8) an 'Adjustment Factor' which can be entered by admin to adjust for how the system actually works to reduce 'false' signals if the system does not work as initially expected. This is represented as a percentage affecting the calculations. While it is a goal of the present invention to automatically detect many system coefficients, some system coefficients may be user input.

The energy generated by each monitored electrical system is recorded and the data server may then determine comparative information based upon at least one of the background constant, the diagnostic variable, the system coefficient and the energy generated to determine a comparative value of the monitored electrical system. The term comparative value is intended to include any value that compares one system to another system or a group of systems. For example, this may be as simple as an "underperforming" designation when the system's performance is less than another system or group of systems performance in terms of power generated.

The normalized performance is then calculated. This is an ongoing calculation which is done for each monitored electrical system which is connected to the software. Essentially, the Normalized Performance is a monitored electrical system's actual performance for a given time period multiplied by its individual System Coefficient.

The formula for this for a given time period is:

$$NP = Gen * SC$$

This equation is relevant to performing comparative information and comparative diagnostics since it enables the results from disparate systems to be 'normalized' and therefore directly compared. These normalized performance readings can then be aggregated into larger periods (24 hours, 7 days, 1 month) for comparison.

The comparative information may be a 'geographic average'. The geographic average may be calculated by an algorithm which produces an average of the normalized performances for each area covered. One purpose is to be able to efficiently perform comparative diagnostics regularly (e.g. every 5 minutes) for a large number of areas containing a large number of renewable energy systems without overly taxing the servers' processors. According to one embodiment, the main steps of this are as follows: (1) The software will randomly select a predetermined number (for example forty (40)) renewable energy systems within each of the algorithm's defined localities; (2) The normalized performance for these forty (40) systems will be summed and then divided by forty (40); (3) This results in a statistically significant geographic average which will then be recorded on the database; (4) An important feature of this algorithm is that much of the complexity is dealt with at the individual renewable energy system level with the system coefficient. The simplicity of the algorithm is important for processor efficiency and ongoing data production.

There may be a comparative diagnostics process. Once the normalized performance and the geographic average are known for a given renewable energy system, these two figures can be compared to determine how well the system is performing vis-à-vis expectations. The reason the results of this are valid regardless of time of year or environmental conditions is because these factors are all controlled for within the local sampling of related systems. Based on the factors noted above which can degrade system performance, the comparative diagnostics can be used to determine when a monitored electrical system is performing sub optimally, therefore the comparative value may be "underperforming" or any other term indicating an issue. If the comparative value falls below certain thresholds (e.g. 7.5% below the Geographic Average signals a system issue) these diagnostics can then be used to remediate the issue and improve the system's performance. The diagnostics can be broken out into periods of different length (24 hours, 7 days and 1 month) which have the following benefits: (i) 24 Hour Comparisons: While a 5 minute segment may show variance between one renewable energy system and the group's geographic average, the variance may not be due to any inherent system issue (e.g. a single cloud may be temporarily affecting one system without impacting others in the vicinity). However, over a 24 hour period, these environmental factors are normally controlled for, and any significant variance will reveal a legitimate system issue. The fact that this is done over a rolling 24 hours means that the information will be received by the renewable system owner or service provider relatively quickly, without the requirement of waiting for a weekly or monthly report; (ii) Weekly Comparisons: Though this does not provide the same sort of timely information that is provided by 24 Hour Comparisons, the additional data will allow for more accurate diagnostic comparisons since environmental variables will have even less impact; (iii) Monthly Comparisons: While more accurate than Weekly Comparison, this will be used mostly as a reporting mechanism to show system status and performance.

The sample system may have at least one inverter (14) in communication with the monitored electrical system (e.g. 50, 30). The inverter (14) is an electronic circuit that converts direct current (DC) to alternating current (AC). There may also be at least one return monitor (18) determining the energy returned to a grid by said at-least one monitored electrical system. At least one background constant may be determined and saved in the data server(s). The monitored electrical system (e.g. 30, 50) may be at least partially powered by at least one alternate energy source. There may be at least one generation monitoring device (e.g. 58), which calculates the energy generated at each consumer's premises by the monitored electrical system (e.g. 30, 50); at least one communication node (64) in communication with each at least one generation monitoring device (e.g. 58); at least one data server (10) in communication with communication node (e.g. 64), wherein the data server(s) (10) accept information from the communication node (e.g. 64) to determine the power generated at a first user's premises (100) and compare the power generated at a first user's premises (100) to Comparative Information obtained from at least two monitored electrical systems (e.g. 102, 104, 106, 108, 110, 112, 114) to determine if the first user's monitored electrical system (100) is within a predetermined deviation from the comparative information. This may provide a comparative value. The communication node may be further comprising a data storage means for storing usage information. For example, the communication node (64) may be a computer with a hard drive that acts as a data storage means for storing usage information. The generation monitoring device may be selected from the group consisting of pulse meter, temperature meter, electromechanical meter, solid state meter, flow meter, electric meter, energy meter and watt meter. There may also be at least one return monitoring device in communication with the inverter which calculates the energy returned to a grid by the system.

The monitored electrical system may be, for example, a solar system, solar panel system, photovoltaic, thermal, wind powered, geothermal, hydropower. A secondary energy source (e.g. 52) may be in communication with and at least partially powering the monitored electrical system. It should be understood, though, this is only for ancillary power in the event that the renewable energy source (50) is not capable of entirely powering the at premise monitored electrical system.

The generation monitoring device may be any type of meter, by way of example, this may include a pulse meter, temperature meter, electromechanical meter, solid state meter, flow meter, electric meter, energy meter and watt meter. An installation will have a communication node or hub set up at the location with the system. One of the communication nodes may act as a hub. These devices connect to the internet and send the data collected by the nodes to the Server. They have the following properties: The hub has a web server and connects to a standard internet connection (Ethernet). It does not require a computer or other device to make this connection. Each hub has its own unique IP or DNS address. The hub is configured by a web browser. The web browser allows the hub to have specific nodes assigned to it. This set up feature will allow another hub in the area to be set up with its own nodes so that all can operate wirelessly without disruption. Also, the hub is able to configure specific aspects of the hub, such as the connection with the server, data recording and time settings and the ability to configure the attached nodes, including their recording properties.

The hub may connect wirelessly or through wire-line including through AC power to the various nodes in its network and may handle several nodes, sending up the data of each within a separate data stream to the server. Typically the hub would plug into a standard AC outlet and have LEDs to show operation and diagnostics. The hub may also record data, so that if the Internet connection is ever down, data from the nodes will not be lost. It will also have the option of a tamper resistant casing and minor router capabilities—so that it could stand in front of a standard router and act as the primary data entry point for a location. The hub will also be able to operate behind a router. All of the hubs may connect to a centralized database for data aggregation. This database will be able to relate the information from each node according to the time recorded. Specific data which will be saved may include: (1) hub IP#/DNS information; (2) node IP#/DNS information/name; (3) Timestamp increment; (4) Hot water flow by unit (gallon or liter) per time increment; (5) Electric flow by unit (kilowatts) per time increment; (6) Fuel flow by unit (depends on fuel type) per time increment; and (7) Other information as required (e.g. water temperature).

An installation will typically have one or more generation recording nodes. In this way, the step of remotely acquiring required data for at least one monitored electrical system to provide acquired electrical system data may be carried out. The generation recording node may be typically connected wirelessly to the hub, and connected directly to the inputs/outputs from the monitored electrical system. They communicate constantly with the various devices and transfer data which is then sent to the server. They may have the following properties: The first required node connects to a flow meter attached to the Water Tank that is connected to the Solar Hot Water system. This node will operate as a pulse meter, 'clicking' whenever a unit (either a gallon or a liter) of hot water passes from the tank. The second required node connects to either the electric panel at the switch for the Hot Water tank's electric power OR to a flow/other meter for gas/oil to the secondary heater for the Hot Water tank. The node may have a data storage means for storing flow/usage information. There may also be other nodes, which may be used to measure other aspects of the system and gain even more accurate readings. For example: the temperature of the hot water on an ongoing basis. The system may be monitored from a remote location (such as a computer in a different location).

It is envisioned that the present invention provides a set of devices, systems and methods to accurately and remotely measure the utilized energy generated from Solar Hot Water (SHW) systems in real-time. Specifically, the data input from a pulse meter (which is connected to a flow meter from the hot water tank) and the data input from a Watt meter (which is connected to an electrical panel for secondary electrical heating in the hot water tank) OR another pulse meter (which is connected to a flow meter on a fuel line that serves as a secondary heating source) may be calculated and software used to combine them on a centralized server. The combined data is then used to calculate the utilized energy generated by the Solar Hot Water system by determining the total amount of energy represented by the hot water used and subtracting any secondary energy (e.g. electrical or fuel) that was also used to heat the water. With additional calculations which take into account the general starting temperature of the water entering the tank and also subtracting for any energy used for other purposes (e.g. pumping water), the system will be able to isolate the precise utilized energy generated by the renewable (i.e. solar) component of the system. This will result in an accurate measurement of the renewable energy generated and consumed for a given time-period which can then be used to monitor efficiency, determine the actual payback period of the system, qualify for incentives and carbon credits, etc.

Each installation may have two or more Data Nodes. These are typically connected wirelessly to the Hub, and connected directly to the inputs/outputs from the Solar Hot Water system. They communicate constantly with the Hub, transferring data which the Hub then sends up to the server. They may have the following properties: The first Required Node connects to a flow meter attached to the Water Tank that is connected to the Solar Hot Water system. This Node will operate as a pulse meter, 'clicking' whenever a unit (either a gallon or a liter) of hot water passes from the tank. The second Required Node connects to either the electric panel at the switch for the Hot Water tank's electric power OR to a flow/other meter for gas/oil to the secondary heater for the Hot Water tank. The Node may have a data storage means for storing flow/usage information. Together, the data gathered from these Required Node connections allow the software on the serve to convert the utilized hot water into an accurate reading of utilized solar energy by subtracting the energy required to by the secondary heating mechanism. The term utilized generation refers to the energy generated by the at-premise power system, less any energy that has not been consumed by the at premise power system (e.g. the energy used to heat water that remains in the tank and is not subsequently used). Note that the term "at-premise power system" is one type of monitored electrical system, as claimed. There may also be other Nodes, which may be used to measure other aspects of the system and gain even more accurate readings. For example: the temperature of the hot water on an ongoing basis. The system may be monitored from a remote location (such as a computer in a different location).

Typically each Node connects to a specific hub. It is set up to do so through the browser interface for the Hub. The connection to the Hub is typically wireless, though these can also be connected through Ethernet wiring. Wireless transmissions between the Hub and Nodes will have data encryption. There will be the ability to create a tamper resistant casing around the Node. This is important to ensure the accuracy of the actual power utilized. The Node has two wire input areas for pulses. These, combined with the time stamp, will be sent up to the Server. The computer processor implemented server may be at a remote location. The Node also has a connection for a Watt sensor. This will have the following characteristics: The Watt sensor can handle 1-3 phase hook ups and will be compatible with clamps as well as loop sensors. According to one preferred embodiment, the basic formula to calculate utilized generation for a given period is as follows:

$$util = (fl1 * temp * conv * dur) - (fl2 * dur)$$

In this formula, util is the utilized generation, or utilized power generated, by the SHW system for the period, fl1 is the flow in units of hot water from the hot water tank during the time increment (flow is the usage for a water heater, it may be other measures for different at premise power systems), temp variable is the difference between the starting temperature of the water when it enters the tank and when it leaves. In the basic conversion equation, this will be kept as a constant, but for systems with material changes in entry and exit temperature, these will be measured and included in the equation. An example of this would be for a system in which the cold water pipe entering the system is not insulated and is exposed to outdoor conditions, conv is a conversion constant variable which is the constant for converting the BTUs required to heat the water from the entry to exit temperature (or temp) into Kilowatts, dur variable is the period. This will generally be a month, though a shorter period may be chosen. The fl2 variable is the flow in units of energy for the secondary heating source. It is important to note that the calculation will be different if the secondary heating source is provided by fuel. This is recorded in the same length increments as the fl1 variable.

The components (node (100), hub (102) and server (10) make up the required core components needed to accurately measure the actual usable output from a Solar Hot Water (SHW) system. Essentially, the hub (102) connects to multiple nodes (100) which simultaneously measure the secondary power going into the system along with the hot water going out. Controlling for any background power requirements (e.g. for pumping), it can measure the usable BTUs created by solar by analyzing the measurements at the server (104) level.

It is important to be able to measure the usable energy generated by Solar Hot Water systems (SHW systems). As the most efficient systems available by a significant margin compared to Photovoltaics (PV), Solar Hot Water system can provide high-efficiency, inexpensive power today. But not only are they less well known/publicized than PVs, it can be difficult to precisely prove their effectiveness since there are fewer ways to efficiently measure their utilized production than with PVs. This makes accurate payback calculations more difficult, and may prevent some companies from purchasing these systems. Another important reason to be able to accurately measure the utilized power from SHW systems is to benefit from incentives. While many states have general rebates for SHW system for homeowners, larger installations, which potentially have greater commercial and environmental benefits are more difficult to apply for since an easy method of accurately monitoring the usable power generated and converting it over time into kilowatt hours is not readily available. Also, this would allow the sale/trading of carbon credits from SHW systems. The ability to remotely monitor utilized energy in real time provides addition capabilities on the part of those maintaining the solar systems in terms of their ability to find issues and increase the systems' efficiency.

Once information regarding utilized generation has been generated, it may be displayed on a portal for use in the following: determining the exact utilized power generated by the SHW system for a given duration to calculate the impact of the system (and potentially its actual payback period); calculating utilized power for monitoring and diagnostics vis-à-vis anticipated performance; Calculating power generated for incentives and carbon credits. To determine the carbon credits, the method may comprise the step of calculating an equivalent amount of carbon which would have been created to generate the power utilized for the at least one Period to provide a carbon deficit. Also, the method may comprise the step of offering carbon credits according to the carbon deficit. The step of calculating carbon deficit may take into account any energy generated. The Carbon credit Periods may start on the first of a month and end on the last day of a month. This may match the billing cycles.

The at least one at-premise monitored electrical system may be a solar system, solar panel system, photovoltaic, thermal, wind powered, geothermal, hydropower or any other system. Also, the terms at-premises, on premises and at-premise are interchangeable and equivalent. Additionally, for those interested in heating and cooling their dwelling via renewable energy, geothermal heat pump systems that tap the constant temperature of the earth, which is around 7 to 15 degrees Celsius a few feet underground, are an option and save money over conventional natural gas and petroleum-fueled heat approaches. The term at premises renewable power system does not include conventional natural gas and petroleum fueled heat.

The method may further comprise the steps of: monitoring the system from a remote location; and monitoring the utilized generation from a remote location. The method may comprise the steps of: generating an alert when the customer variables are a prescribed percentage different than historical averages. The method may also comprise the steps of monitoring and storing the consumer's customer variables and utilized generation.

It may be desirable to provide a computer processor implemented method of determining system configuration information of a monitored electrical system (e.g. 502) without the need for user input, the method comprising the steps of; constructing a data set of standard performance curves for at least one system type to provide a data set with at least one system type and correlated standard performance curves. Different types of systems have different signatures in the form of standard performance curves from which the system type can be identified. For example, a solar photovoltaic system tends to have an energy profile that looks like FIG. 7, and is dependent on the time of day and weather conditions. Wind generation systems tend to have an energy profile that is highly correlated with the wind speed. Residential consumption patterns tend peak in late afternoon, with offsets for any distributed generation that is located on-site. Patterns in energy data for solar PV, wind, residential consumption, etc. can be identified by comparing the pattern of the energy in the data stream to typical patterns as described above, with consideration for the time of year and weather conditions associated with the data stream. Based on the amount of data available, and how well it matches the typical patterns, a level of confidence can be assigned to identifying a data stream as coming from a particular type of system.

Figure 7:
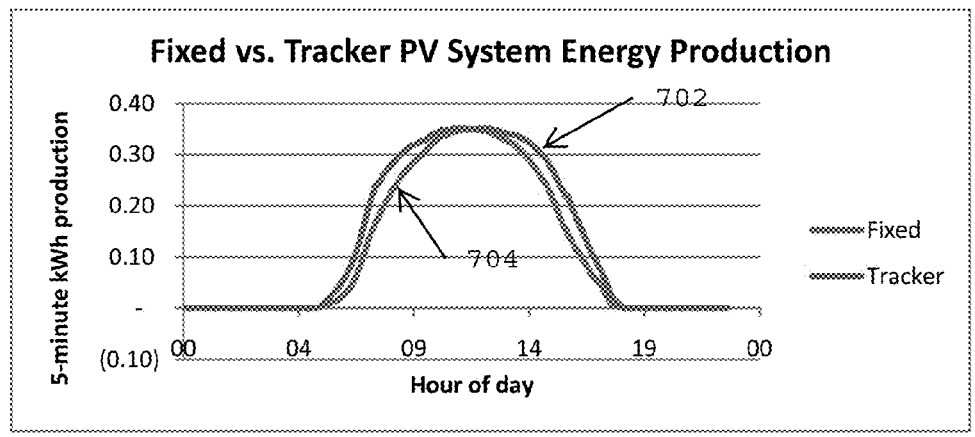
FIG. 7 depicts the present invention.

The method may comprise the step of saving the data set with at least one system type and correlated standard performance curves (for example 700, as shown in FIG. 7) in at least one data server (516). The method may next comprise the step of defining at least one characteristic feature for each at least one system type to provide at least one system type and correlated characteristic feature and saving the at least one system type and correlated characteristic feature in the at least one data server (516). A characteristic feature may be, for example, time of sunrise, time of sunset, associated timestamps, energy consumption, wind system output, weather, configuration, time of year, user habits, system size, tracker versus fixed, energy profile shape, east west orientation, north-south orientation, homeowner type, heating type, temperature sensitivity, consumption data, utilized energy, utilized generation, system derate factors and air conditioning status. It is envisioned that there may be an infinite number of characteristic features. However, it is only important that a characteristic feature be able to be attributed to a system type. There may also be a number of characteristic features assigned to a single system type. There may also be the step of providing a timestamp associated with at least one data set and saving the timestamp associated with at least one data set in the data server. The method may comprise the step of determining the required data to identify the at least one system type according to at least one of standard performance curve and characteristic feature. There may be the step of remotely acquiring required data for at least one monitored electrical system to provide acquired electrical system data; comparing system acquired electrical system data to at least one system type and correlated standard performance curves and system type and correlated characteristic features to provide system configuration information for at least one monitored electrical system to provide the specific type of at least one monitored electrical system. The specific type may refer to the type of monitored electrical system, the location, the installation angle, the system configuration, the model number or any information regarding that particular unit. The system configuration information may be selected from the group consisting of location, longitude, system size, system type and installation angle. Again, there are an infinite number of things that could be system configuration information. The standard performance curve may be selected from the group consisting of energy production profile, geographic average profile, degradation due to temperature, east west orientation, north-south orientation, homeowner type, heating type and air conditioning status.

The method may further comprising the step of: determining a geographic average performance; comparing at least one monitored electrical systems performance to the geographic average performance; alerting at least one user when the at least one monitored electrical systems performance is a predetermined amount lower than the geographic average performance. The user may be the owner of the monitored electrical system, may be a renter, or simply a person who leases the equipment. It may be desirable to perform the steps of: determining if the monitored electrical system can be remotely adjusted; and remotely making a change to said at least one monitored electrical system. It may be desirable to load background constants and diagnostic variables into the data server.

The methodology for completing automated remote identification, to construct a large data set of example patterns for certain types of systems, define certain features that tend to be characteristic of the systems in the data set, and use either statistical correlation techniques, or machine learning optimization (e.g. neural networks) to define classification thresholds, run empirical tests to determine the needed amount of data (i.e., length of history & granularity) in order to automatically identify a system type and use the developed thresholds feature sets and data history thresholds to automatically classify data streams according to different system types. It is also possible to determine the location where a particular solar powered system (generation or consumption) is physically located. This is because the characteristics of the monitored data are influenced by geographic-specific characteristics, like sunrise/sunset times or weather characteristics. As long as the monitored data stream has associated timestamps, it is possible to determine the location by finding a geographic location that would best match the observed energy consumption or generation characteristics of the monitored data stream. For example, if the type of generation source (or consumption) is known, one can model the expected behavior of this generation or consumption data stream under actual recorded weather around the world (including sunrise sunset times), and the best fitting match statistically is likely to be the actual physical location. A few specific examples of how this invention may be applied to determine a device's location follow herein. The solar photovoltaic (PV) system's output will peek at solar noon, so by examining the system's time of peak output (in UTC or some reference time zone), one can calculate the longitude and timezone a PV system is operating in. The output of solar PV systems are highly dependent upon weather. By maintaining a time history of weather conditions across a large area (e.g., North America and Europe), and modeling PV system outputs across all of these geographies, one can match the time history of a PV system's output to the geography of data it most closely matches. This matching process can be improved by narrowing the range of geographic areas (e.g. using the preceding longitudinal technique), or by improving the estimated model output of a PV system via leveraging known system characteristics (either known beforehand or identified as described in the section below about "Identification of system information for a solar PV system"). Output from a wind system is highly dependent on wind conditions. By maintaining a time history of weather conditions across a large area, and modeling the wind system outputs across all the locations, one can match the time history of a wind system's output to the geographic location it most closely matches. Energy consumption by residential or commercial users tends to be both time-of-day dependent (e.g., people come home from work and turn on the television) and weather dependent (e.g., more air-conditioners will be running on hot days). These time and weather dependencies make it possible to perform the same type of statistical matching exercise on consumption data as is done on generation data for renewable energy systems. By maintaining a time history of weather conditions across a large geographic area that the consumption system is known to be within (e.g. North America or Europe), it is possible to statistically match what the most likely location is for the consumption monitoring system.

Once a broad system type has been identified, it is possible to further refine the understanding of the system in the field by identifying the particular characteristics of those systems. This can be done by understanding the drivers of the performance of the systems in the field (e.g., weather, configuration, time of year, user habits, etc.). The following are particular configuration parameters for a solar PV system that can be identified in an automated fashion. This patent application is both for these particular detailed algorithms, as well as the broader idea illustrated here (i.e., similar types of automated configuration information can be determined for other types of systems including wind, consumption, solar thermal, etc.). The basic idea is to identify features as deviations from a typical PV standard performance curve (700), as shown in FIG. Error! Reference source not found. 7. The following is a non-exhaustive list of example parameters like be determined by comparing features of the data stream with the standard performance curve in FIG. 7. FIGS. 7-12 provide examples of standard performance curves and acquired electrical system data.

Figure 8:
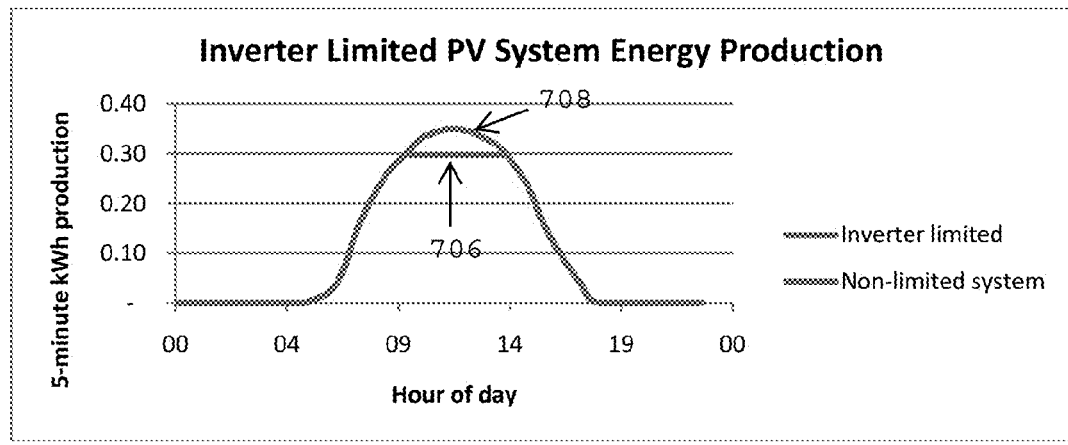
FIG. 8 depicts the present invention.
Figure 9:
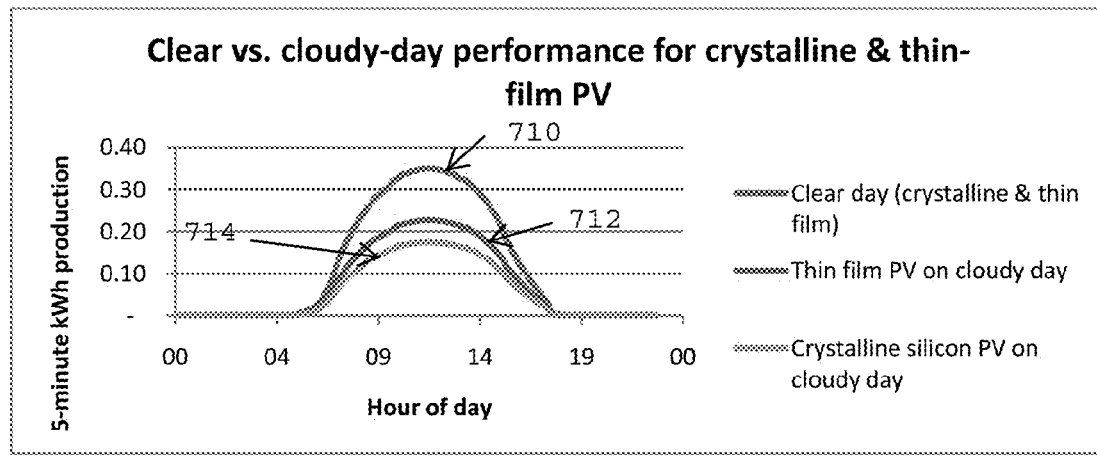
FIG. 9 depicts the present invention.

The size of a monitored electrical system, such as a PV system, can be estimated from measured outputs. If little additional system information is known, the system outputs can simply be scaled for typical PV system derates (i.e., expected losses from things like resistance in wires, inverter efficiency, etc.). If more detailed information is available on the system, either from user input, or from automatically derived parameters as described below, this more detailed information can be used to more finely tune the expected system derate factors, and therefore more accurately estimate system size. Solar PV tracker systems tend to have a less peaked energy profile, with greater total generation, as shown in FIG. 8. This is because they keep the inclined PV surface normal to sun, such that it captures more solar radiation early or late in the day. System matching this type of performance profile can be identified as tracker-type systems. The tracker profile (702) has a less peaked energy profile than the fixed (704) profile as depicted in FIG. 8. In this example, the tracker profile (702) may be the acquired electrical system data and the fixed profile (704) may be the standard performance curve. However, it could be reversed, as long as it is saved in the data set as the system type and correlated standard performance curves. In this way, either profile could serve as the standard performance curve or the acquired electrical system data. This applied for each of the curves shown in FIGS. 7-12, as long as we know what the performance curve is and the associated data set.

Solar PV designers often undersize the inverter for cost saving reasons. If the inverter is substantially undersized, this can show up as shaved peaks (706) in the PV generation profile. If these shaved peaks appear, they indicate the maximum capacity of the inverter for a particular system. An example of these shaved peaks is shown below in FIG. 9, and they can be easily identified by the flat top, where normally a curved surface (708) would appear.

Figure 10:
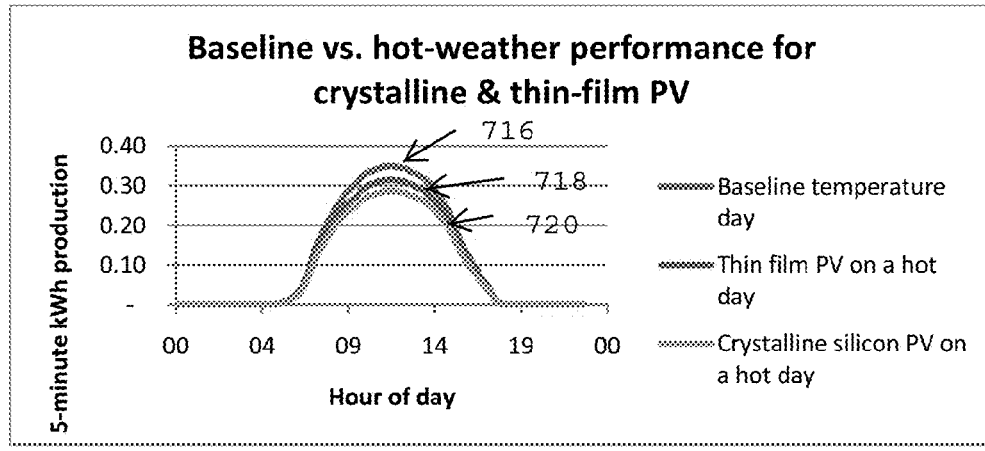
FIG. 10 depicts the present invention.

Solar PV cells produce less power under diffuse light conditions (i.e., cloudy days) than under a bright clear sunny day. Thin-film PV cells are relatively less impacted by diffuse light, as compared to polycrystalline PV cells. Examining the ratio of system performance on clear sunny days to cloudy days with diffuse light, one can differentiate between thin-film and crystalline PV systems, as shown in FIG. 10, where it can be seen that an example thin-film PV system is less impacted than a similar-sized crystalline silicon system (i.e., the ratio of B/A is greater than C/A) FIG. 10 depicts the impact of diffuse light on crystalline vs. thin film solar PV systems. FIG. 10 depicts the 5 minute kWh production by the time of day. As can be seen the clean day (crystalline and thin film) (710) system performance can serve as a measuring point to the thin film PV on a cloudy day (712) and crystalline silicon PV on a cloudy day (714). Once the performance of a particular system is obtained, it may be compared to the standard performance curves as depicted in FIG. 10 and it may be determined the type of system.

Figure 11:
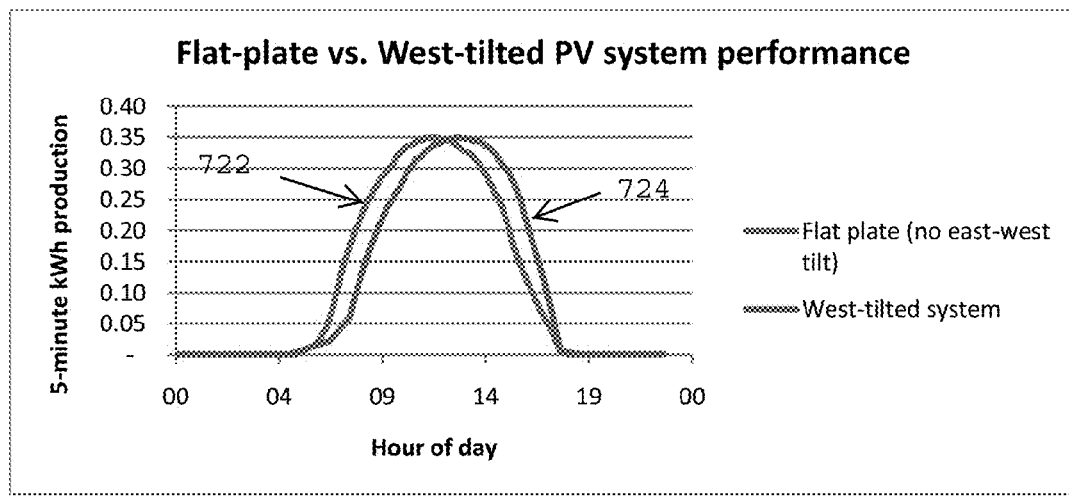
FIG. 11 depicts the present invention.

Another measure of the difference between cell technologies, is the sensitivity of those cells to temperature. At higher temperatures PV modules will produce less energy. However, the amount of degradation with an increase in temperature is dependent upon the PV technology. For example, FIG. 11 shows how crystalline silicon PV systems are more significantly affected by increases in temperature, relative to similarly sized thin-film systems. By assessing the amount of degradation due to temperature (e.g., comparing the data stream for two different days, where the measured ambient temperature was different across the days, using reference cells and various thin-film technology performance curves), one can estimate what the likely PV technology involved is.

Figure 12:
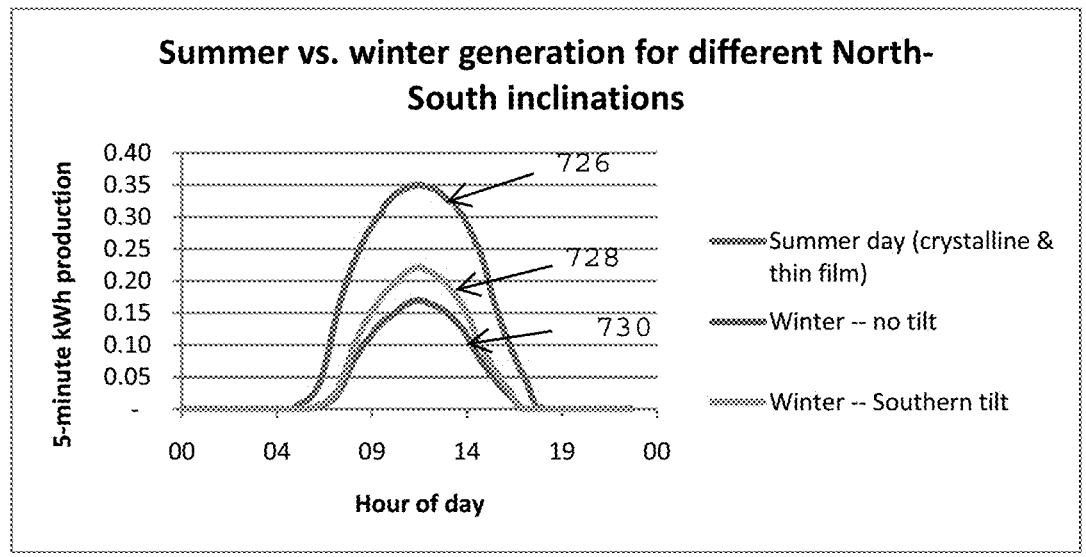
FIG. 12 depicts the present invention.

FIG. 12 depicts a baseline vs. hot-weather degradation impact for thin-film and crystalline silicon PV systems. With respect to east-west orientation: If a PV system is perfectly flat, the distribution of energy produced in the morning and the afternoon should be roughly even, as depicted by flat plate line 722 showing no east west tilt. If the PV system is angled towards the east more energy will be produced in the morning than the evening, and vice versa if the system has a western tilt. A western-tilted PV system is illustrated in FIG. 12 as line 724. Examining the skew in the PV production data one can estimate the aggregate east-west angle of the system in question, thus determining the angle at which the PV modules are inclined from the data alone. FIG. 12 provides an example of how a western-tilted PV system has a skewed generation profile.

Figure 13:
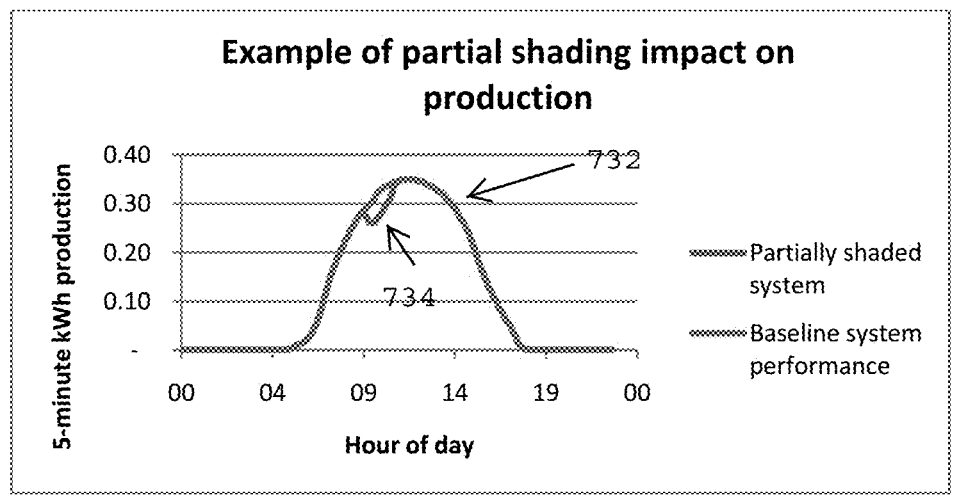
FIG. 13 depicts the present invention.
Figure 14:
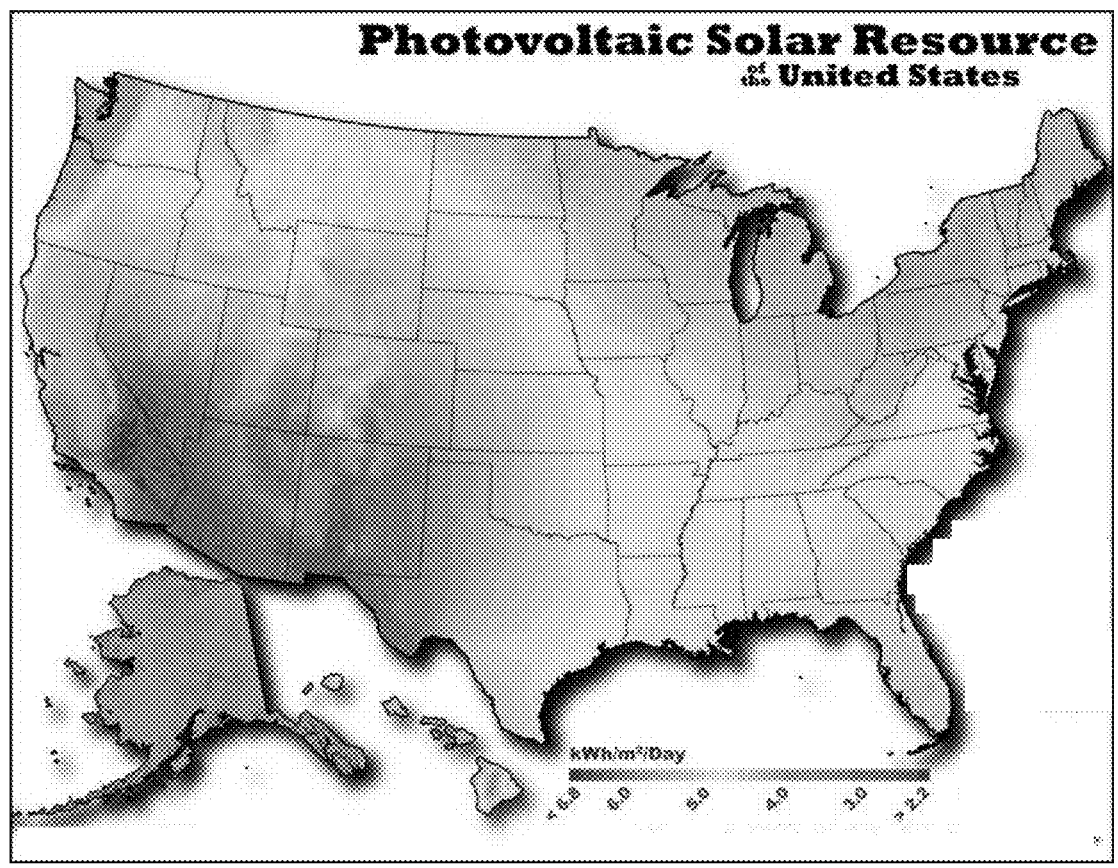
FIG. 14 depicts the present invention.

North-south orientation: the Sun is much higher in the sky in the summer than in winter, so the amount of PV generation tends to be much higher at solar noon in the summer and then solar noon in the winter, assuming a flat plate panel with no inclination. FIG. 13 depicts PV generation standard performance curve for a summer day 726, winter with no tilt 728 and winter with southern tilt 730. If the solar PV cells are angled more towards the south, the change in energy output from summer to winter will be less (and vice versa for Northern angled PV cells), as shown in 13. The ratio of summer to winter production (e.g., B/A vs. C/A in FIG. 13) is largely determined by the north-south orientation of the PV array, so with production data that spans summer and winter months, the north-south inclination can be estimated.

If a PV system is partially shaded, the shading can be detected as a dip in the otherwise expected smooth generation curve, as illustrated in 14. If this power production dip (as depicted by line 734) consistently appears over time, it is indicative of some sort of shading factor (e.g., tree line, adjacent buildings, etc.). Line 734 represents acquired electrical system data for a system having a shading factor. Line 732 represents a standard performance curve. In this way, the present invention can detect a potential problem and notify the user. This may be particularly useful, for example, if a tree may be trimmed to reveal the solar panels resulting in increased production. In this way, the present invention may comprise the step of identifying a resolvable problem (e.g. a tree creating partial shading) and contacting the consumer (e.g. send the consumer an email) if the system acquired electrical system data deviates a predetermined amount from the standard performance curve.

Substantial information about the configuration of a home or business that underlies a energy consumption monitoring system can be acquired by observing the pattern of consumption data. A number of specific examples for this type of information acquisition were defined above for solar PV systems. The same idea of examining the data stream, and tying it to an underlying model of how the system works, can be used to test hypotheses for what underlies the consumption data stream. Hypotheses that prove true indicate data about the configuration of the home or business for which the consumption data is being gathered. The examples provided are intended to describe and provide clarity regarding the present invention, but are not intended to be made in a limiting sense.

A computer processor (e.g. 10) implemented method may develop irradiance mapping using a distributed network of solar photovoltaic systems (e.g. 102, 104, 106), the method comprising the steps of: selecting a predetermined geographic area having at least five solar photovoltaic systems to provide a photovoltaic system (107); calibrating the photovoltaic system (107) and reversing the photovoltaic system performance model using a computer processor to solve the irradiance input value. The step of reversing the photovoltaic system performance model using a computer processor to solve the irradiance input value may be performed according to simple methods. One example may have only two inputs:

$$P=A+BT_m*H_i+CH_i+DH_i^2, \text{ where}$$

$T_m$=PV array temperature
$H_i$=incident irradiance
P=power generated
A, B, C, and D are constants determined by least square fits The solar panels convert the irradiance to electric energy, at a rate dependent on a large number of factors. There are many possible models for this conversion process, but two of the most significant factors are temperature and irradiance. Accordingly, this is a simple power model. The temperature may obtained from a third party internet weather feed source and saved in the at least one data server. Alternatively, the temperature may be obtained by a temperate probe and saved in a data server. The present invention may perform step of calculating irradiance according to the irradiance input value, energy output and weather data using a computer processor to provide a single irradiance point; and mapping at least two said single irradiance points to create an irradiance map. There may be the step of determining an irradiance input value from system performance values, the calibrated system performance model and the temperature The energy output may be determined as the DC power from the solar PV panel is converted to AC power by an inverter. A gateway then measures the AC power generated and communicates the AC power generation data (plus additional data from the inverter where available) back to a centralized server over the internet as the energy output. Using energy output, temperature, system configuration information, and other relevant data for the PV performance model, irradiance is calculated for each system in the geographic area. The irradiance calculations may be smoothed, eliminating outliers and converging on a good estimate of the average irradiance in the local region.

A time series sequence of observations in the form of irradiance measurements may be ordered in time. Inherent in the collection of this type of data is some form of variations. There are many methods for reducing the effect due to such variations. This may be referred to as "smoothing" or "reducing the noise". When applied, these techniques more clearly reveal the underlying trends of the data. According to one aspect of the present invention, there may be the step of smoothing at least two single irradiance points. The generated irradiance data is used to construct a detailed irradiance map of the region, and further smooth the data on longer time scales leveraging information from satellite models and new PV systems or weather stations that are installed in a given area. One manner to accomplish smoothing may be by providing moving averages. Moving averages rank among the most popular techniques for the preprocessing of time series. They are used to filter random "white noise" from the data, to make the time series smoother or even to emphasize certain informational components contained in the time series. Exponential Smoothing is also a very popular scheme to produce a smoothed Time Series. Whereas in Moving Averages the past observations are weighted equally, Exponential Smoothing assigns exponentially decreasing weights as the observation get older. In other words, recent observations are given relatively more weight in forecasting than the older observations. Double Exponential Smoothing is better at handling trends. Triple Exponential Smoothing is better at handling parabola trends. An exponentially weighted moving average with a smoothing constant a, corresponds roughly to a simple moving average of length (i.e., period) n, where a and n are related by:

$$a=2/(n+1) \text{ OR } n=(2-a)/a.$$

Thus, for example, an exponentially weighted moving average with a smoothing constant equal to 0.1 would correspond roughly to a 19 day moving average. And a 40-day simple moving average would correspond roughly to an exponentially weighted moving average with a smoothing constant equal to 0.04878. Although there are numerical indicators for assessing the accuracy of the forecasting technique, the most widely used approach to compare smoothing methods is in using visual comparison of several forecasts to assess their accuracy and choose among the various forecasting methods. In this approach, one must plot (using, e.g., Excel) on the same graph the original values of a time series variable and the predicted values from several different forecasting methods, thus facilitating a visual comparison. The foregoing example of smoothing techniques are provided as examples, as can be appreciated by those of skill in the art, there are many smoothing techniques the goal of which is to more clearly reveal the underlying trends of the data.

There may be the step of utilizing comparative information from nearby photovoltaic systems to provide at least one comparative information irradiance point; and mapping the at least two single irradiance points and at least one comparative information irradiance point to create the irradiance map. This may also be actual irradiance readings from irradiance sensors. In this way, it can supplement the data achieved according to the present invention.

This may be repeated for other geographic areas to assemble a larger-scale irradiance map (See FIG. 15 for a sample irradiance map). Note that typically, an irradiance map may provide the amount of solar radiation in kWh/m²/day. There may also be the step of predicting irradiance based on extrapolation of current data and weather forecasts.

There may be the step of automatically determining system configuration information for the solar photovoltaic systems; and utilizing the system configuration information to perform the step of reversing the photovoltaic system performance model using a computer processor to solve the irradiance input value. This may be accomplished by constructing a data set of at least one standard performance curve for at least one system type to provide a data set with at least one system type and correlated standard performance curves and saving the data set with at least one system type and correlated standard performance curves in at least one data server; defining at least one characteristic feature for each at least one system type to provide at least one system type and correlated characteristic feature and saving at least one system type and correlated characteristic feature in at least one data server; determining the required data to identify at least one system type according to at least one of standard performance curve and characteristic feature; remotely acquiring the required data for at least one solar photovoltaic system to provide acquired solar photovoltaic systems data and saving the acquired solar photovoltaic systems data in at least one data server; comparing system acquired solar photovoltaic systems data to at least one system type and correlated standard performance curves and system type and correlated characteristic features to provide system configuration information for at least one solar photovoltaic system to provide the specific type of at least one solar photovoltaic system.

Related applications are concerned with systems and methods for estimating solar irradiance components (global horizontal irradiance, direct normal irradiance, diffuse horizontal irradiance, plane of array irradiance, plane of array direct irradiance, plane of array diffuse irradiance, plane of array ground reflected irradiance) using measurements of plane of array irradiance or global horizontal irradiance, in conjunction with atmospheric models of irradiance components.

Solar irradiance upon a plane of array, or IPoA, is composed direct (HBEAM), diffuse (HDIFF), and ground reflected irradiance (HGRF). In the special case of a horizontal plane of array, IPoA is equivalent to global horizontal irradiance (GHI) and the ground reflected component is 0. Direct normal irradiance (DNI) is the direct irradiance component of plane of array irradiance where the plane is perpendicular to Sun's rays given the current solar position. Diffuse horizontal irradiance (DHI) is the diffuse irradiance component of horizontal IPoA or GHI.

Measuring solar irradiance requires field deployment of precisely configured scientific instruments, typically an actinometer variant or the methods described herein. Actinometers are instruments designed to measure the heating power of radiation and variants of this instrument are designed for measuring solar irradiance. One variant, the pyranometer, is used to measure broadband irradiance and can measure GHI or IPoA. The pyranometer is also capable of measuring DHI when outfitted with a shadow band and sun tracking equipment to obscure direct radiation. Another variant, the pyrheliometer, is calibrated for direct irradiance and tracks the sun in order to measure DNI. Basic pyranometers are economically feasible for many projects, but the cost of tracking equipment required to measure DNI and DHI are often prohibitive to deploy at the level of granularity required, so often times only the aggregate GHI or IPoA is measured using sensors in the field.

Related applications provides methods for calculating an irradiance modifier for adjusting modeled solar irradiance components according to measured GHI or IPoA values. Also described is usage of this methodology to develop three (3) alternative solar irradiance component estimation models. A model for estimating DNI, DHI, and IPoA from measured GHI and an atmospheric solar irradiance model. A model for estimating HBEAM, HDIFF, and HGRF from measured IPoA and an atmospheric solar irradiance model. A model for estimating GHI, DNI, and DHI from measured IPoA and an atmospheric solar irradiance model.

The following are variables within the related application; (1) MEASURED SOLAR IRRADIANCE DATA: This provides measurements of solar irradiance that includes GHI or IPoA among other variables. (2) LOCATION, TIME AND ORIENTATION VARIABLES: These are various variables corresponding to a location and time. These variables include latitude, longitude, date, and time. If the measured data was IPoA, orientation angle and tilt angle are also required. (3) ATMOSPHERIC IRRADIANCE COMPONENT ESTIMATION CALCULATIONS: These are a set of formulas that estimate the components of solar irradiance (i.e., direct, diffuse, and ground-reflectance irradiance) based on atmospheric conditions. (4) IRRADIANCE MODIFICATION LOGIC: This is the logic for calculating the irradiance modifier based on observed and estimated irradiance amounts. (5) GHI BASED DNI, DHI, & IPOA ESTIMATION MODEL: This is the model that utilizes measured GHI and an atmospheric solar irradiance model to estimate DNI, DHI, and IPoA. (6) IPOA BASED HBEAM, HDIFF, & HGRF ESTIMATION MODEL: This is the model that utilizes measured IPoA and an atmospheric solar irradiance model to estimate HBEAM, HDIFF, and HGRF. (7) IPOA BASED GHI, DNI, & DHI ESTIMATION MODEL: This is the model that utilizes measured IPoA and an atmospheric solar irradiance model to estimate GHI, DNI, and DHI.

Definition of Variables $GHI_{model}$=modeled global horizontal irradiance based on atmospheric model $DNI_{model}$=modeled direct normal irradiance based on atmospheric model $DHI_{model}$=modeled diffuse horizontal irradiance based on atmospheric model $IPoA_{model}$=modeled plane of array irradiance based on atmospheric model $GHI_{measured}$=measured Global Horizontal Irradiance from a sensor device in the field $DNI_{estimated}$=estimated direct normal irradiance based on GHI measurements and model calibration $DHI_{estimated}$=estimated diffuse horizontal irradiance based on GHI measurements and model calibration $IPoA_{estimated}$=estimated plane of array irradiance based on GHI measurements and model calibration IMOD=irradiance estimate modifier DNI, DHI, and IPoA Estimation Model Based on Measured GHI 1. Use atmospheric model to calculate $GHI_{model}$, $DNI_{model}$, $DHI_{model}$, and $IPoA_{model}$
2. IMOD=$GHI_{measured}/GHI_{model}$
3. $DNI_{estimated}$=IMOD*$DNI_{model}$
4. $DHI_{estimated}$=IMOD*$DHI_{model}$
5. $IPoA_{estimated}$=IMOD*$IPoA_{model}$ HBEAM, HDIFF, and HGRF Estimation Algorithm Definition of Variables $IPoA_{model}$=modeled plane of array irradiance based on atmospheric model $HBEAM_{model}$=modeled plane of array direct irradiance based on atmospheric model $HDIFF_{model}$=modeled plane of array diffuse irradiance based on atmospheric model $HGRF_{model}$=modeled plane of array diffuse irradiance based on atmospheric model $IPoA_{measured}$=modeled plane of array irradiance from a sensor device in the field $HBEAM_{estimated}$=estimated plane of array direct irradiance based on IPoA measurements and model calibration $HDIFF_{estimated}$=estimated plane of array diffuse irradiance based on IPoA measurements and model calibration $HGRF_{estimated}$=estimated plane of array diffuse irradiance based on IPoA measurements and model calibration IMOD=irradiance estimate modifier HBEAM, HDIFF, and HGRF Estimation Model Based on Measured IPoA 1. Use atmospheric model to calculate $IPoA_{model}$, $HBEAM_{model}$, $HDIFF_{model}$ and $HGRF_{model}$
2. $IMOD=IPOA_{measured}/IPOA_{model}$
3. $HBEAM_{estimated}=IMOD*HBEAM_{model}$
4. $HDIFF_{estimated}=IMOD*HDIFF_{model}$
5. $HGRF_{estimated}=IMOD*HGRF_{model}$ GM, DNI, and DHI Estimation Definition of Variables $IPoA_{model}$=modeled plane of array irradiance based on atmospheric model $GHI_{model}$=modeled global horizontal irradiance based on atmospheric model $DNI_{model}$=modeled direct normal irradiance based on atmospheric model $DHI_{model}$=modeled diffuse horizontal irradiance based on atmospheric model $IPoA_{measured}$=measured plane of array irradiance from a sensor device in the field $GHI_{estimated}$=estimated global horizontal irradiance based on IPoA measurements and model calibration $DNI_{estimated}$=estimated direct normal irradiance based on IPoA measurements and model calibration $DHI_{estimated}$=estimated diffuse horizontal irradiance based on IPoA measurements and model calibration IMOD=irradiance estimate modifier GHI, DNI, and DHI Estimation Model Based on Measured IPoA 1. Use atmospheric model to calculate $IPoA_{model}$, $GHI_{model}$, $DNI_{model}$, and $DHI_{model}$
2. $IMOD=IPOA_{measured}/IPOA_{model}$
3. $GHI_{estimated}=IMOD*GHI_{model}$
4. $DNI_{estimated}=IMOD*DNI_{model}$
5. $DHI_{estimated}=IMOD*DHI_{model}$ The corrections of field measurements of global horizontal irradiance or plane of array irradiance for diffuse or direct irradiance quantities can be used for a variety of applications where it is important to know where the light is direct or diffuse light. Among those applications are the following: Solar resource assessment (identifying locations where solar PV, bio-mass production, etc., could be valuable). Many applications of solar resources behave differently according to the proportion of light made up of directly or diffuse light. For example, concentrating solar energy systems work well under directly light, but poorly under diffuse light, so it is important to understand the amount of light components, not just the total amount of light. The present invention may be used to better assess solar resources based on the components of light.

This may be used to evaluate solar projects and provide a performance yield of solar projects. Performance of solar energy production systems can be done using total sunlight measurements, but using components of the sunlight is more precise, however. Using the systems and methods provided herein, the performance yield of systems can be done more accurately, since the total sunlight measured by a physical sensor can be disaggregated into components of light.

The systems and methods may be utilized to provide system degradation analysis. Along with performance yield, the degradation of systems can be more accurately modeled using components of light, which can be determined using the technology described herein.

Crop growth modeling can be improved if the diffuse and direct components of light can be modeled. Related applications provide more accurate estimates of those components. Crop growth, assessing the current state of growth, or estimating the difference in growth between two points in time can be improved if the diffuse and direct components of light can be modeled.

Dust and particulate matter affects the proportion of direct and diffuse light in the atmosphere, because the dust & particulates increase the amount of light diffusion. Related applications provide more accurate estimates regarding the amount of direct and diffuse light in an area, with the use of a simple inexpensive irradiance sensor the measures total light. Therefore, this technology can be used to more accurately analyze the impact of dust and particulates in the air (or conversely, the technology can be used to estimate the amount of dust in the atmosphere based on the amount of light diffusion).

Direct normal irradiance, diffuse horizontal irradiance and plane of array irradiance may be estimated using measured global horizontal irradiance, modeled global horizontal irradiance, modeled plane of array irradiance, modeled direct normal irradiance, modeled diffuse horizontal irradiance and using an irradiance modifier.

Plane of array direct irradiance, plane of array diffuse irradiance, and plane of array ground reflected irradiance may be estimated using measured plane of array irradiance, modeled plane of array irradiance, modeled plane of array direct irradiance, modeled plane of array diffuse irradiance, modeled plane of array ground reflected irradiance and using an irradiance modifier.

Global horizontal irradiance, direct normal irradiance, and diffuse horizontal irradiance may be estimated using measured plane of array irradiance, modeled plane of array irradiance, modeled global horizontal irradiance, modeled direct normal irradiance, modeled diffuse horizontal irradiance and using an irradiance modifier.

In a related disclosure a computer implemented method of estimating at least one solar irradiance component is provided, the method comprising: obtaining a sensor measurement from an instrument (such as an actinometer, a pyranometer or a pyrheliometer) to provide a measured global horizontal irradiance (GHImeasured), wherein the measured global horizontal irradiance (GHImeasured) consists of at least one estimated diffuse horizontal irradiance (DHIestimated) and an estimated direct normal irradiance (DNIestimated); providing at least one modeled component, wherein at least one of the modeled components is a modeled global horizontal irradiance based on an atmospheric model (GHI model); calculating an irradiance estimate modifier (IMOD) in a computing device according to the measured global horizontal irradiance (GHImeasured) and the modeled global horizontal irradiance (GHI model); providing at least estimated one solar irradiance component by a computing device according to the irradiance estimate modifier (IMOD) and at least one modeled component. Each step in this method may be provided or input into a computer.

The at least one modeled component may be selected from the group consisting of modeled global horizontal irradiance based on atmospheric model (GHImodel), modeled direct normal irradiance based on atmospheric model (DNImodel), modeled diffuse horizontal irradiance based on atmospheric model (DHImodel), modeled plane of array irradiance based on atmospheric model (IPoAmodel), modeled plane of array direct irradiance based on atmospheric model (HBEAMmodel), modeled plane of array diffuse irradiance based on atmospheric model (HDIFFmodel) and modeled plane of array ground reflected irradiance (HGRFmodel).

The estimated solar irradiance component may be selected from the group consisting of global horizontal irradiance (GHI), direct normal irradiance (DNI), diffuse horizontal irradiance (DHI), plane of array irradiance (IPOA), plane of array direct irradiance (HBEAM), plane of array diffuse irradiance (HDIFF) and plane of array ground reflected irradiance (HGRF).

According to one aspect of the invention, the step of obtaining a sensor measurement may be obtained from an pyranometer outfitted with a shadow band and sun tracking equipment to obscure direct radiation. The step of obtaining a modeled global horizontal irradiance based on an atmospheric model (GHI$_{model}$) is according to at least one of weather data and satellite imagery.

There may be the step of calibrating at least one of an estimated direct normal irradiance (DNI$_{estimated}$) and an estimated diffuse horizontal irradiance (DHI$_{estimated}$). The step of calibrating may be corrected for solar position without ground reflected irradiance due to horizontal positioning.

Another aspect of the related invention provides a computer implemented method of estimating at least one solar irradiance component, the method comprising: obtaining a sensor measurement (by way of example this may be obtained from an instrument such as an actinometer, a pyranometer and a pyrheliometer) to provide a measured plane of array irradiance (IPoA$_{measured}$), wherein the measured plane of array irradiance (IPoA$_{measured}$) consists of at least an estimated plane of array direct irradiance (HBEAM$_{estimated}$), an estimated plane of array diffuse irradiance (HDIFF$_{estimated}$) and plane of array ground reflected irradiance (HGRF$_{estimated}$); providing at least one modeled component, wherein at least one of the modeled components is a modeled plane of array irradiance based on an atmospheric model (IPoA$_{model}$); calculating an irradiance estimate modifier (IMOD) in a computing device according to the measured plane of array irradiance (IPoA$_{measured}$) and modeled plane of array irradiance based on an atmospheric model (IPoA$_{model}$); providing at least one estimated solar irradiance component by a computing device according to the irradiance estimate modifier (IMOD) and at least one modeled component.

Each step in this method may be provided or input into a computer or computing device. It should be understood that a computing device may be any microprocessor based device. By way of example, it may be a computer, smartphone or any device that is capable of performing computations. Each step of the present invention that requires computations may be performed by the computing device.

The at least one modeled component of the present invention may be selected from the group consisting of modeled global horizontal irradiance based on atmospheric model (GHI$_{model}$), modeled direct normal irradiance based on atmospheric model (DNI$_{model}$), modeled diffuse horizontal irradiance based on atmospheric model (DHI$_{model}$), modeled plane of array irradiance based on atmospheric model (IPoA$_{model}$), modeled plane of array direct irradiance based on atmospheric model (HBEAM$_{model}$), modeled plane of array diffuse irradiance based on atmospheric model (HDIFF$_{model}$) and modeled plane of array ground reflected irradiance (HGRF$_{model}$).

The adjusted solar irradiance component may be selected from the group consisting of global horizontal irradiance (GHI), direct normal irradiance (DNI), diffuse horizontal irradiance (DHI), plane of array irradiance (IPOA), plane of array direct irradiance (HBEAM), plane of array diffuse irradiance (HDIFF) and plane of array ground reflected irradiance (HGRF).

The step of obtaining a sensor measurement may be obtained from an pyranometer outfitted with a shadow band and sun tracking equipment to obscure direct radiation. The step of obtaining a modeled global horizontal irradiance based on an atmospheric model (GHI$_{model}$) may be according to at least one of weather data and satellite imagery.

The solar industry is rapidly expanding in North America with new solar projects coming online at an accelerating rate. In addition to utility scale solar farms, many companies and consumers are installing residential and commercial sized solar power projects to capture the value of distributed solar. With larger amounts of capital invested in distributed solar energy, it is increasingly import to optimize the placement of solar sites and the maintenance of installed assets. The present invention addresses these problems by providing high-quality irradiance estimates that can be used for both solar prospecting of potential new sites, and performance yield tracking of installed assets.

The present invention lowers the total cost of managing a fleet of distributed PV systems, users can leverage on-demand estimates of irradiance to prospect for new installation sites and analyze the performance of their existing installations. Users get the benefits of a physical on-site irradiance sensor without the cost of additional hardware.

Solar irradiance, the energy from the Sun's electromagnetic radiation, is the source of solar power production. The amount of energy generated by a solar energy conversion system depends largely on the amount of solar energy, or irradiance, reaching the system. In order to fully understand the performance of a solar power project, it is generally necessary to collect information on the amount of irradiance that was available to the project. Larger solar power systems often have physical irradiance sensors installed to collect irradiance data in the field using specialized instrumentation such as a pyranometer or reference cell. These irradiance measurement devices are expensive and are often cost prohibitive to deploy for residential or light commercial systems.

The present invention provides a cost efficient approach that can generate highly accurate estimates of solar irradiance without the need of a physical sensor. The need for physical instrumentation to measure solar irradiance at residential or light commercial sites is removed and the physical sensor data at larger sites is complimented, by providing high-accuracy solar irradiance estimates. The tools available to solar industry for monitoring and analyzing solar energy system performance are enhanced and improved.

A robust and versatile model is provided, capable of generating solar irradiance estimates in real time, as well as building a historical record of solar irradiance estimates from an archive of data. Solar irradiance estimates are provided in real time at a 30-minute time interval. Leveraging the archives of solar production and environmental conditions data, a historical record of solar irradiance estimates can be retroactively created. This may be completely integrated with a monitoring platform, so irradiance estimates can be used throughout the platform in the same manner as if a site or sites had physical solar irradiance sensors (e.g., running performance yield reports, charting solar irradiance alongside system or fleet performance, supporting the commissioning process, etc.) Additionally, data can be extracted for solar prospecting, estimating geographic solar resources, or external performance analysis.

The present invention assesses, at least, the two factors affecting the amount of solar irradiance reaching a location on Earth: (1) A location's spatial relationship with the Sun; and (2) The atmospheric conditions impacting the transmission of solar radiation. Determining the Sun-Earth relationship has been well proven and reasonably straight-forward to model, but determining atmospheric conditions accurately is still an active problem facing academia and industry. The present invention generates solar irradiance estimates, and starts by using established astrophysical formulas to calculate solar position and the amount of solar irradiance reaching the top of the atmosphere above a location. Then, theoretical atmospheric algorithms are used to estimate the amount of solar irradiance transmitted under theoretical clear sky conditions. Next, the estimates are filtered through an atmospheric interference model to calculate the total amount of solar irradiance at a given location. Finally, these estimates are refined by methodology for leveraging solar power performance data and environmental sensors from a Network to generate high accuracy solar irradiance estimates.

The present invention uses a multi-faceted approach. It may be calibrated using high quality government solar irradiance sensors and proprietary data from the Network, generating a robust model capable of accurately estimating solar irradiance in a variety of climates and weather conditions. Additionally, estimates will continue to improve as more monitoring nodes are added to the platform.

Real-time and historical solar irradiance measurements provide a significant enhancement to the effectiveness of a monitoring platform. This value can be realized through greater analytic and diagnostic capabilities of current systems, through more immediate system troubleshooting during the commissioning process, and through more accurate predictive capabilities of both production and site potential. However, the availability of solar irradiance data at a system's location is often limited due to cost of physical solar irradiance sensors. The present invention fulfills this need by providing high accuracy solar irradiance estimates for individual systems or entire fleets, without the requirement or cost of physical sensors. Once this data is available, several stakeholders can leverage this data.

The present invention provides real-time, weather-adjusted diagnostics while crews are still on site to correct issues at system start-up, ensuring proper configuration from the start (and avoiding unnecessary truck rolls). Also a performance yield analysis with the first week or two of data to quickly identify any minor system issues before they persist too long. The present invention also provides system degradation diagnostics which remove the "wild card" of system performance—irradiance—by evaluating system production in the context of actual irradiance over time. Degradation issues may be pinpointed earlier in the life-cycle with configurable tolerance thresholds and alerting capabilities. The present invention may be used in project and site location planning, by leveraging current irradiance values and historical estimates at specific locations to tighten modeling assumptions for project planning. The irradiance insights provided can be leveraged across regional solar capacity models to help predict solar production in near real-time regional solar production estimates and forecasts. Additionally, forecasting capability may be obtained. The irradiance data obtained can be leveraged to provide pinpoint views of irradiance values in specific locations, which can be leveraged for power and agricultural planning purposes.

Sunlight mapping is used across a number of domains, since it is a geographic-based data set from which user can apply the data sets to their particular problem. Similar to transportation maps, vegetation maps, political maps, etc., irradiance maps can serve a wide variety of purposes for people needing to understand the geographic relationship, including how the geographic relationship has varied/will vary over time. Historical irradiance maps can be used in a variety of domains such as for renewable energy evaluations: understanding historical variations in irradiance can help with assessing the value of deploying solar in a particular region, particular when used in conjunction with other renewable energy maps (e.g., assessing the value of combining wind, solar, and hydro power in a particular region). Additionally, irradiance maps can be used to understand historical performance of installed solar photovoltaic systems. Understanding historical irradiance can be used to assess what type of building design is appropriate for a given area (e.g., what level of insulation is needed, what should the window design be, etc., to achieve the desired level of human comfort and building energy efficiency). The historical irradiance map can also be used to understand historical energy consumption by a building, accounting for the amount of sunlight energy that was incident on the building. In civil engineering and hydrology: Irradiance maps can be used to build numerical models of snowmelt runoff, an important tool for everything from reservoir design for hydropower, dam and flood control infrastructure assessments, water availability for drinking water or agricultural purposes, etc. Irradiance maps are a critical input for all these models, since the amount of sunlight energy (irradiance) drives the rate at which water is being released from a melting snowpack. Irradiance maps can also be used to model and understand historical crop growth patterns, as well as understand potential crop growth in certain areas.

Current-state irradiance maps can be used across a variety of domains, similar to the historical records. For example, current irradiance maps can be used: to understand current performance of installed solar photovoltaic systems; to understand current state energy consumption by a building, accounting for the amount of sunlight energy that is incident on the building; to analyze current building energy consumption, identify deviations in building energy consumption form expectations, and optimize a building's control systems to most efficiently handle the current irradiance load. Current irradiance maps can be used to operate real-time numerical models of snowmelt runoff, an important tool for operating and predicting the water impact on everything from reservoir design for hydropower, dam and flood control infrastructure assessments, water availability for drinking water or agricultural purposes, etc. Irradiance maps are a critical input for all these models, since the amount of sunlight energy (irradiance) drives the rate at which water is being released from a melting snowpack. Current irradiance maps can be used to model and predict crop growth that is currently occurring, which can then be used to forecast harvest volumes and supply impacts, along with the impact of these supply changes on commodity markets (e.g., corn futures, wheat futures, soybean futures, etc.).

Forecasting irradiance maps can be used for all the same purposes as a current-state irradiance map, but applied to understanding how the irradiance will change in near future and optimally planning for that state. For example, forecasts can be used: to estimate future output from solar photovoltaic systems; to optimize the building control systems to lower operational costs (e.g., pre-cool the building on the morning of a forecasted sunny day, so as to consume the electrical energy earlier in the day when electric power prices are lower); to operate forecasting numerical models of snowmelt runoff, an important tool for operating and predicting the water impact on everything from reservoir design for hydropower, dam and flood control infrastructure assessments, water availability for drinking water or agricultural purposes, etc.; to model and predict crop growth that is will occur, which can then be used to forecast harvest volumes and supply impacts, along with the impact of these supply changes on commodity markets (e.g., corn futures, wheat futures, soybean futures, etc.); for solar resource assessment (identifying locations where solar PV, bio-mass production, etc., could be valuable). Solar resource assessments are a sub-type of the work described above for irradiance maps.

The historical, current, and forecast irradiance maps could be used to identify locations where solar photovoltaic, bio-mass production, or other solar-dependent resources would be most valuable. This can be important when searching for a suitable location to deploy a planned solar resource dependent asset, or when assessing what value solar resources could add to a property under consideration for acquisition or development. Irradiance mapping can be used to evaluate solar projects including the performance yield of solar projects. Solar photovoltaic system performance can be assessed based on the amount of energy output as electricity, vs. the amount of sunlight energy as input, known in the industry as "performance yield". Irradiance estimates from the model described herein can be used to perform this performance yield analysis both retroactively as well as on a real-time basis. Performance yield assessments are very useful to both the owners and operators of a solar photovoltaic system, so the assessments are very valuable tools.

Irradiance mapping can be used for system degradation analysis as solar photovoltaic systems degrade over time. Understanding the different rates of degradation, which can vary due to equipment technology, climate, and manufacturing quality, is very important for owners and operators of solar photovoltaic systems. Leveraging historic and current irradiance estimates from the systems and method described herein, in conjunction with the actual energy produced by the PV system, enable estimates of the actual system degradation rate (e.g., if irradiance is constant and output is decreasing, the system is degrading in performance).

Irradiance mapping can be used to provide thermal simulations of materials (e.g. PV panel temperature). Thermal changes in materials can have a variety of impacts on those materials, from changing their performance properties (e.g., solar PV system are less efficient when hot) to affecting their degradation rates (e.g., hotter systems may degrade more rapidly). Since irradiance is a major driver of material temperature, historic and current estimates of irradiance from the systems and method described herein can be used as input to simulations of the thermal state of materials, and then the analysis of the impact of that thermal state on behavior.

The thermal profile of a potential building can be used for siting purposes. Understanding irradiance can be important when making design and siting decisions for a potential new building. Irradiance is important for modeling the thermal building characteristics (thermal profile of a proposed or existing building) for air-conditioning or heating requirements, to ensure optimal design specification (e.g., insulation ratings to be used) or equipment sizing (e.g., appropriate capacity of air conditioners or heating units). Irradiance is also important for energy efficiency evaluation and tracking of building performance. Using the irradiance estimates described herein, one can assess the environmental load (e.g., including sunlight energy in hot seasons) and compare it to the energy consumption of the building (e.g., for air conditioning) to assess the efficiency of the building.

The systems and methods described herein may be useful to model and predict the performance of civil engineering structures changes with temperature. For example, steel expands and becomes less rigid with increasing temperature. These effects have significant implications for structures like large buildings and bridges. An irradiance model provides the capability to better model the sunlight heating element of understanding the structure's performance.

Irradiance modeling, as described herein, can be used to understand historical crop growth patterns, e.g., the expected yield rate in a particular geography, given a certain amount of sunlight. Current irradiance estimates and forecasts can be used to forecast crop growth, assess the current state of growth, or estimate the difference in growth between two points in time. Irradiance is also an important element of weather modeling, since sunlight energy is a primary driver of weather patterns. The current and forecast irradiance can be used to estimate the amount of snowmelt that will occur, which determines that the remaining snow and ice will be (i.e., irradiance is a key input to modeling the snow and ice coverage of an area). Irradiance is important in estimating the albedo effects from changes in snow melt. Albedo is the reflection coefficient of a surface, and is an important concept in climatology, because it determines how much sunlight energy is absorbed as heat rather than reflected back into space. Snow has a high albedo, since it reflects most light. Since irradiance impacts snow melt, which in turn decreases albedo, which in turn affects the climate, the irradiance model in this patent plays an important role in estimating the future albedo in an area (i.e., the irradiance model can be used to predict snow melt, which can then be used to predict albedo as an input to climate models).

The irradiance model can be used to estimate snow melt, which provides input to models or estimates of available water for agriculture, drinking water, and other purposes. The present invention envisions quantification of atmospheric conditions impacting solar irradiance transmission using human-readable general weather description text and estimation of ground irradiance based on ground weather condition observations and time using parsing and weighting of human-readable general weather description text, dew-point data and temperature data. Estimation of ground irradiance based on the combination of satellite-based estimation systems with ground weather conditions and time using parsing and weighting of human-readable general weather description text, dew-point data and temperature data.

The present invention combines qualitative weather observations and sensor-based weather observations to estimate solar irradiance. According to one aspect of the present invention, a computer implemented weather based method of estimating solar irradiance is provided, the method comprising: accepting a text description of a weather condition for a given time in a computing system; classifying by a computing system the text description of a weather condition for a given time into a classification string according to the text description of a weather condition for a given time by a computing system; providing, in a computing system, a dummy variable representing the respective classification string match; providing a coefficient for each dummy variable in a computing system; accepting in a computing system a theoretical clear sky global horizontal irradiance, a coefficient for temperature, ambient temperature and a dew point; subtracting the dew point from the temperature to provide a Cloud Formation Level (CFL) value in a computing system; providing a coefficient for the CFL; determining an estimated global horizontal irradiance by a computing system, wherein the estimated global horizontal irradiance is the theoretical clear sky global horizontal irradiance multiplied by the total of the sum of the series of coefficients for respective dummy variables multiplied by the dummy variable representing the respective classification string match added to the coefficient for temperature multiplied by the ambient temperature added to the CFL multiplied by a coefficient for the CFL.

The step of accepting a text description of a weather condition for a given time in a computing system may be, for example, a user types "SUNNY" into a computing system. Without limitation, other examples of text descriptions of a weather condition may be sunny, cloudy, rainy, showers, snowing, overcast, thunderstorms, windy, breezy. The text description of a weather condition for a given time, ambient temperature and dew point may be obtained from a weather feed (as opposed to being typed in by an actual user). The weather feed may be an internet weather feed and may include a brief description of weather, temperature and dew point (among other variables).

The step of classifying by a computing system the text description of a weather condition for a given time into a classification string according to the text description of a weather condition for a given time by a computing system may be performed according to the following:

WS=Brief Text Description of Weather Conditions
$STR_1 \ldots STR_{n-1}$=Classification Strings to match against WS
$D_1 \ldots D_n$=Dummy Variable representing the respective classification string match (0 for no match, 1 for match)
$C_1 \ldots C_n$=Coefficients for respective Dummy Variables
GHC=Theoretical Clear Sky Global Horizontal Irradiance
GHI=Global Horizontal Irradiance Quantification of Qualitative Weather Observation

```
D₁...Dₙ = 0
for (a=1:n-1) {
    if (STRₐ matches WS) {
        return (Dₐ=1)
    }
    if (a==n-1) {
        return (Dn=1)
    }
}
Optimize (C₁...Cₙ) for {
    GHI/GHC = Σᵢ₌₁ⁿ (CᵢDᵢ)
} constrained by {
    0 ≥ Cᵢ ≤ 1
}
```

The dummy variable may be either 0 or 1. The dummy variable may be 0 when the step of classifying by a computing system the text description into a classification string according to the text description of weather condition by a computing system is not a match. The dummy variable may be 1 when the step of classifying by a computing system the text description into a classification string according to the text description of weather condition by a computing system is a match.

There may be the step of weighting the coefficient for each dummy variable in a computing system. For example, it may be determined that the term "SUNNY" is generally accurate, so it may be weighted at 100%. In contrast, the term "overcast" may not be as reliable, so it may be weighted at 60%.

The step of determining an estimated global horizontal irradiance by a computing system, wherein the estimated global horizontal irradiance is the theoretical clear sky global horizontal irradiance multiplied by the total of the sum of the series of coefficients for respective dummy variables multiplied by the dummy variable representing the respective classification string match added to the coefficient for temperature multiplied by the ambient temperature added to the CFL multiplied by a coefficient for the CFL may be according to the following methodology.

Definition of Variables $D_1 \ldots D_n$=Dummy Variable representing the respective classification string match (0 for no match, 1 for match)
$C_1 \ldots C_n$=Coefficients for respective Dummy Variables
CI=Cloud Index calculated from visible spectrum satellite image
$C_{CI}$=Coefficient for Cloud Index
$IR_1 \ldots IR_m$=Brightness Temperature calculated from respective infrared spectrum satellite image
$C_{IR1} \ldots C_{IRm}$=Coefficient for respective brightness temperature
TEMP=Ambient Temperature
$C_{TEMP}$=Coefficient for Temperature
CFL=Calculated by subtracting Dew Point from Temperature
$C_{CFL}$=Coefficient for CFL
GHC=Theoretical Clear Sky Global Horizontal Irradiance
GHI=Global Horizontal Irradiance Estimate Weather Based Solar Irradiance Model $$GHI = GHC * \left( \sum_{i=1}^{n} (C_1 D_1) + C_{Temp} Temp + C_{CFL} CFL \right)$$

According to another embodiment, a satellite and weather based computer implemented method of estimating solar irradiance is provided, the method comprising: accepting a text description of a weather condition for a given time in a computing system; classifying by a computing system the text description of a weather condition for a given time into a classification string according to the text description of a weather condition for a given time by a computing system; providing, in a computing system, a dummy variable representing the respective classification string match; providing a coefficient for each dummy variable in a computing system; accepting in a computing system a theoretical clear sky global horizontal irradiance, a coefficient for temperature, ambient temperature and a dew point; subtracting the dew point from the temperature to provide a Cloud Formation Level (CFL) value in a computing system; providing a coefficient for the CFL; determining an estimated global horizontal irradiance by a computing system, wherein the estimated global horizontal irradiance is the theoretical clear sky global horizontal irradiance multiplied by the total of the sum of the series of coefficients for respective dummy variables multiplied by the dummy variable representing the respective classification string match added to the coefficient for temperature multiplied by the ambient temperature added to the CFL multiplied by a coefficient for the CFL added to a cloud index multiplied by a coefficient for a cloud index added to the total of the sum of the series of coefficients for respective brightness temperature multiplied by the brightness temperature. The dummy variable may be either 0 or 1. The dummy variable is 0 when the step of classifying by a computing system the text description into a classification string according to the text description of weather condition by a computing system is not a match. The dummy variable is 1 when the step of classifying by a computing system the text description into a classification string according to the text description of weather condition by a computing system is a match.

The cloud index may be calculated from visible spectrum satellite image, which may be obtained from an internet geostationary satellite imagery feed. The brightness temperature may be calculated from respective infrared satellite image. The infrared satellite image may be obtained from an internet geostationary satellite imagery feed.

A satellite and weather based computer implemented method of estimating solar irradiance as claimed may be according to the following.

Definition of Variables $D_1 \ldots D_n$=Dummy Variable representing the respective classification string match (0 for no match, 1 for match)

$C_1 \ldots C_n$=Coefficients for respective Dummy Variables

CI=Cloud Index calculated from visible spectrum satellite image $C_{CI}$=Coefficient for Cloud Index $IR_1 \ldots IR_m$=Brightness Temperature calculated from respective infrared spectrum satellite image $C_{IR1} \ldots C_{IRm}$=Coefficient for respective brightness temperature TEMP=Ambient Temperature $C_{TEMP}$=Coefficient for Temperature CFL=Calculated by subtracting Dew Point from Temperature $C_{CFL}$=Coefficient for CFL GHC=Theoretical Clear Sky Global Horizontal Irradiance GHI=Global Horizontal Irradiance Estimate Satellite and Weather Based Solar Irradiance Model $$GHI = GHC * \left( \sum_{i=1}^{n} (C_1 D_1) + C_{Temp} Temp + C_{CFL} CFL + C_{CI} CI + \sum_{i=1}^{m} (C_{IR1} IR_1) \right)$$

It should be understood that the foregoing relates to preferred embodiments of the invention and that modifications may be made without departing from the spirit and scope of the invention as set forth in the following claims.

We claim:

1. A computer implemented weather based method of estimating solar irradiance, the method comprising:
accepting a text description of a weather condition for a given time in a computing system;
classifying by a computing system the text description of a weather condition for a given time into a classification string according to the text description of a weather condition for a given time by a computing system;
providing, in a computing system, a dummy variable representing the respective classification string match;
providing a coefficient for each dummy variable in a computing system;
accepting in a computing system a theoretical clear sky global horizontal irradiance, a coefficient for temperature, ambient temperature and a dew point;
subtracting the dew point from the ambient temperature to provide a Cloud Formation Level (CFL) value in a computing system;
providing a coefficient for the CFL;
determining an estimated global horizontal irradiance by a computing system to develop a solar irradiance estimation model for evaluating a solar resource dependent project, wherein the estimated global horizontal irradiance is the theoretical clear sky global horizontal irradiance multiplied by the total of the sum of the series of coefficients for respective dummy variables multiplied by the dummy variable representing the respective classification string match added to the coefficient for temperature multiplied by the ambient temperature added to the CFL multiplied by a coefficient for the CFL.

2. A method as in claim 1, wherein said dummy variable is either 0 or 1.

3. A method as in claim 2, wherein said dummy variable is 0 when the step of classifying by a computing system the text description into a classification string according to the text description of weather condition by a computing system is not a match.

4. A method as in claim 2, wherein said dummy variable is 1 when the step of classifying by a computing system the text description into a classification string according to the text description of weather condition by a computing system is a match.

5. A method as in claim 1, wherein the text description of a weather condition for a given time, ambient temperature and dew point are obtained from an internet weather feed.

6. A method as in claim 1, further comprising the step of weighting said coefficient for each dummy variable in a computing system.

* * * * *